(12) United States Patent
Tsuchiya et al.

(10) Patent No.: US 7,190,115 B2
(45) Date of Patent: Mar. 13, 2007

(54) DISPLAY DEVICE HAVING SEALING FILM

(75) Inventors: Kaoru Tsuchiya, Kanagawa (JP);
Ryota Fukumoto, Kanagawa (JP);
Satoshi Murakami, Tochigi (JP);
Hiromichi Godo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 101 days.

(21) Appl. No.: 10/738,296

(22) Filed: Dec. 17, 2003

(65) Prior Publication Data

US 2004/0185301 A1  Sep. 23, 2004

(30) Foreign Application Priority Data

Dec. 19, 2002 (JP) .............................. 2002-368984
May 16, 2003 (JP) .............................. 2003-139679

(51) Int. Cl.
*H05B 33/04* (2006.01)

(52) U.S. Cl. ...................... 313/512; 313/504; 313/506

(58) Field of Classification Search ........ 313/498–512, 313/493; 315/169.3; 345/36, 45, 76
See application file for complete search history.

(56) References Cited

U.S. PATENT DOCUMENTS

| | | | | |
|---|---|---|---|---|
| 5,882,761 | A | 3/1999 | Kawami et al. | ............... 428/69 |
| 2001/0002703 | A1* | 6/2001 | Koyama | ...................... 257/40 |
| 2002/0030443 | A1* | 3/2002 | Konuma et al. | ............. 313/504 |
| 2002/0044111 | A1* | 4/2002 | Yamazaki et al. | ............. 345/83 |
| 2002/0057055 | A1* | 5/2002 | Yamazaki et al. | ........... 313/506 |
| 2002/0180371 | A1* | 12/2002 | Yamazaki et al. | ....... 315/169.3 |

FOREIGN PATENT DOCUMENTS

| | | |
|---|---|---|
| EP | 0 776 147 A1 | 5/1997 |
| JP | 9-148066 | 6/1997 |
| JP | 10-335060 | 12/1998 |
| JP | 2000-173766 | 6/2000 |
| JP | 2001-203076 | 7/2001 |
| JP | 2001-357973 | 12/2001 |
| JP | 2003-297552 | 10/2003 |

* cited by examiner

*Primary Examiner*—Christopher M. Raabe
(74) *Attorney, Agent, or Firm*—Cook, Alex, McFarron, Manzo, Cummings & Mehler, Ltd.

(57) ABSTRACT

In order to provide a display device of high reliability in which an amount of moisture and oxygen, which are a factor for deteriorating a characteristics of a display device, entering from a sealing agent is reduced and its manufacturing method, the present invention has a sealing film. Accordingly, an interlayer insulating film including an organic material of the display device (panel) is no longer exposed to the atmosphere outside of the display device. Therefore, it becomes possible to prevent moisture and oxygen outside of the display device from entering inside of the display device through an insulating film and the like including a hygroscopic organic material. In addition, various degradations such as contamination of an inner part of the display device caused by moisture, oxygen and the like, the degradation of electric properties, a dark spot and shrink can be prevented, thus enhancing reliability of the display device.

20 Claims, 25 Drawing Sheets

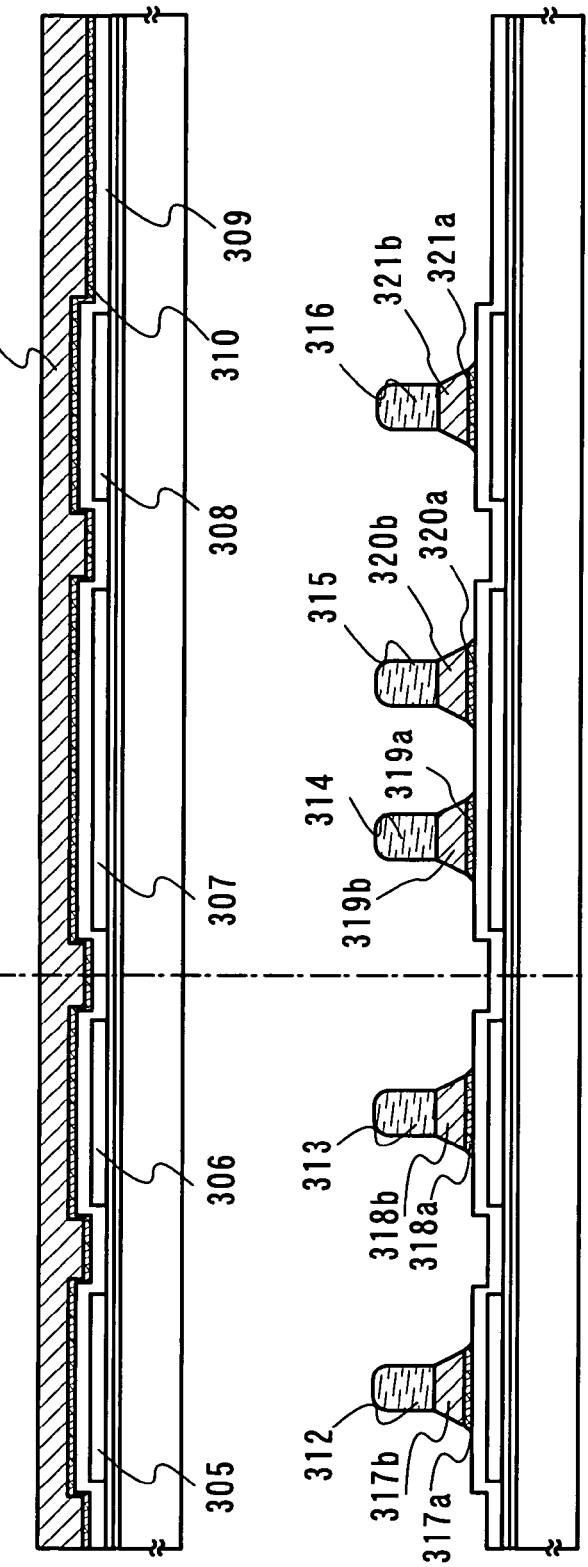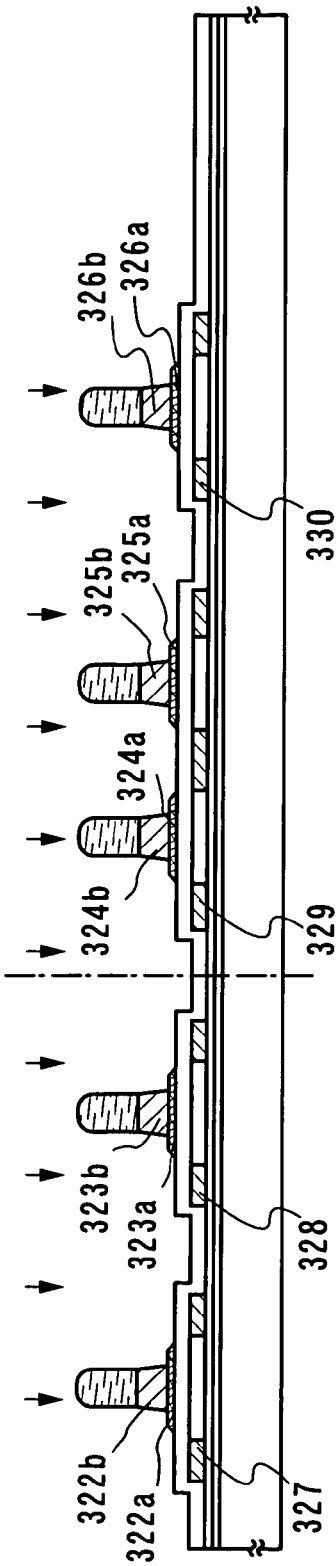

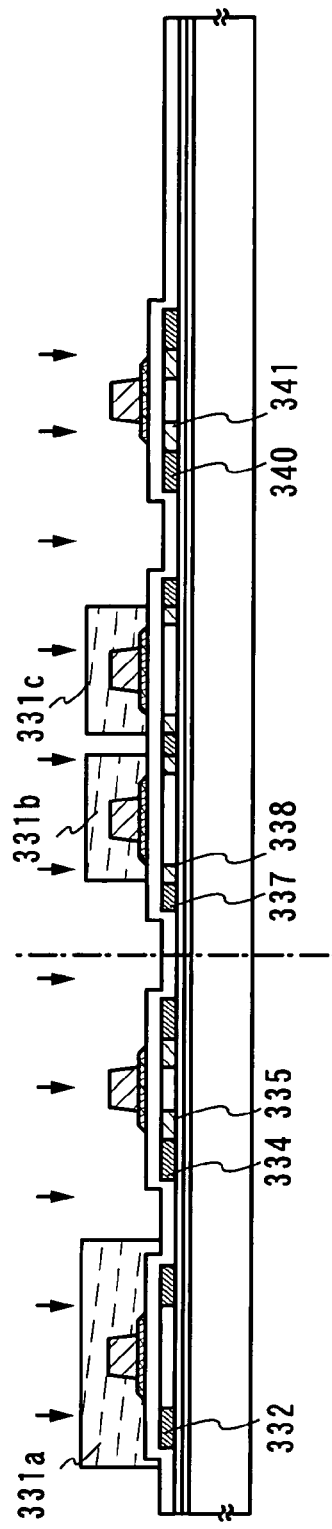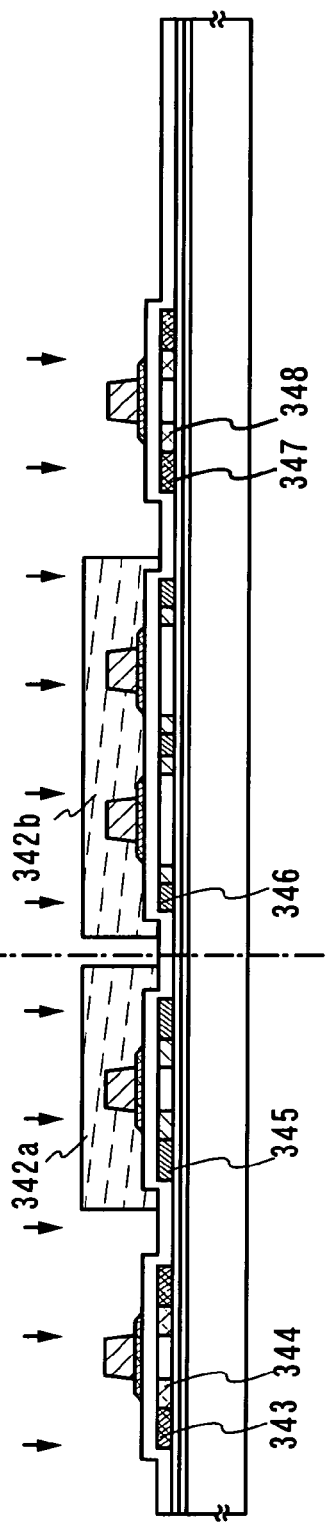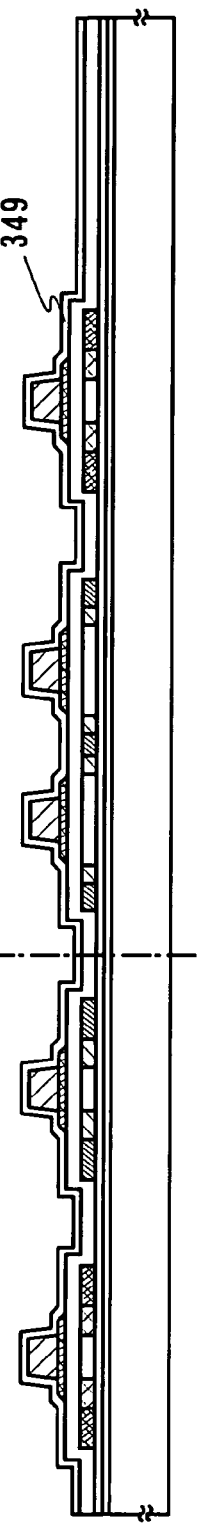
Fig. 8A
Fig. 8B
Fig. 8C

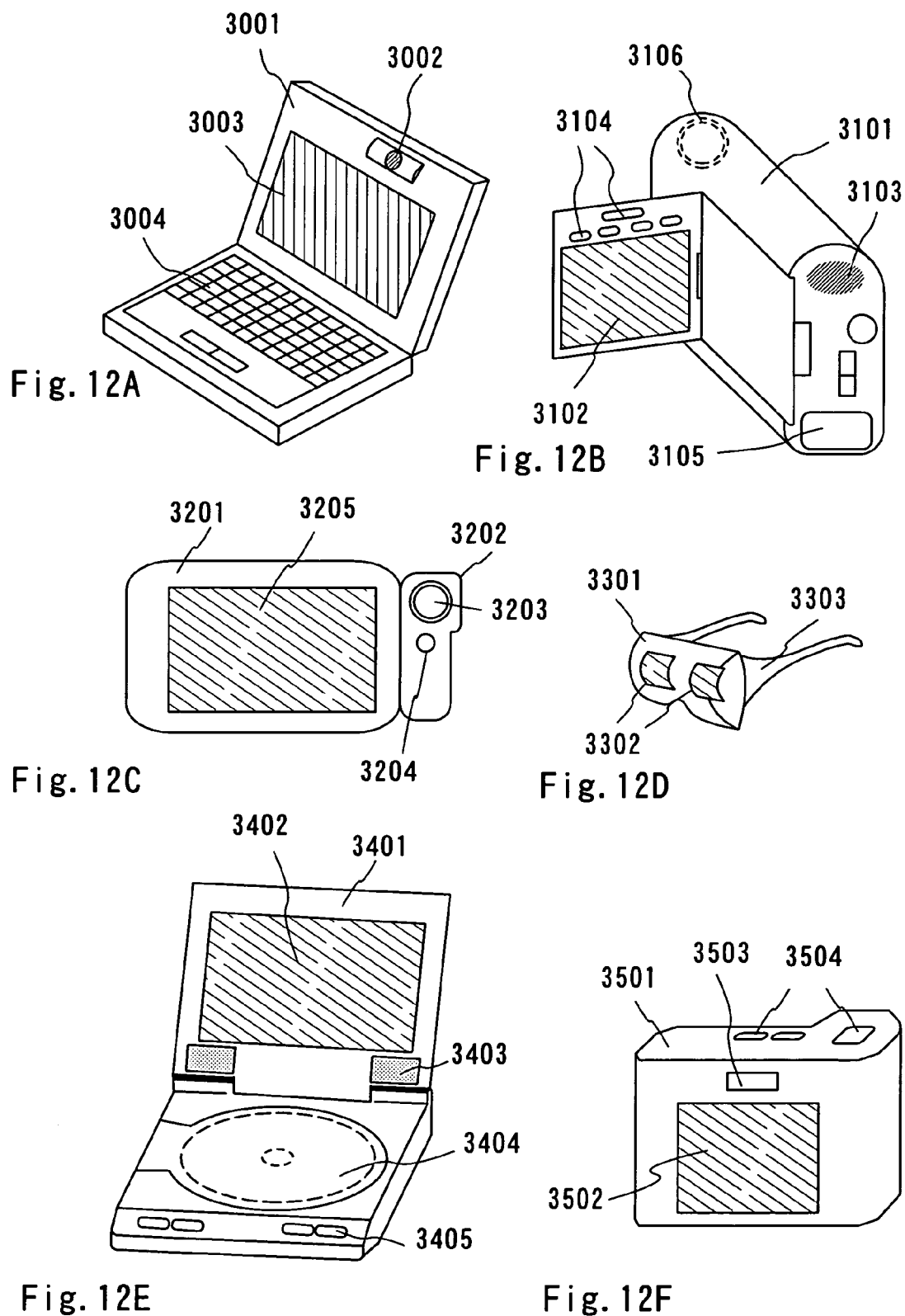

DISPLAY DEVICE HAVING SEALING FILM

FIELD OF THE INVENTION

The present invention relates to a display device including an element which has a light-emitting material (hereinafter referred to as light-emitting element) between electrodes (hereinafter referred to as display device) and a manufacturing method thereof. More specifically, the present invention relates to a display device using a light-emitting material in which EL (Electro Luminescence) can be obtained.

BACKGROUND OF THE INVENTION

Recently, progress has been made in the development of a display device (EL display device) employing a light-emitting element (hereinafter referred to as EL element) which uses EL phenomenon of a light-emitting material. An EL display device does not need a backlight unlike a liquid crystal display because the light-emitting element itself has an ability to emit light. In addition, an EL display device has the advantages of wide viewing angle, high contrast, and so on.

It is said that an EL element emits light by releasing energy when electrons injected from a cathode and holes injected from an anode are recombined at a luminescence center in an organic compound layer to form a molecular exciter and when the molecular exciter moves back to the ground state by applying a voltage with interposing the organic compound layer between a pair of electrodes. Singlet excitation and triplet excitation are known as an excitation state, and it is considered that light-emission can be obtained through both the excitation states.

Moreover, there are an inorganic light-emitting material and an organic light-emitting material as a light-emitting material which is used for an EL element, and an organic light-emitting material that requires a low driving voltage attracts attention.

However, after driving a certain period of time, an organic EL element using an organic material for the EL element has a problem in that light-emitting characteristics such as luminance and luminance uniformity degrade drastically compared to those at the beginning. The low reliability is the main factor for the limited practical application.

Moisture and oxygen which enter the organic EL element from outside are cited as one of the factors for deteriorating the reliability.

In the EL display device (panel) using an EL element, the moisture which enters an inner part leads a serious degradation in reliability to cause a dark spot, shrink and a degradation of luminance from a peripheral part of a light-emitting device. The dark spot is phenomenon in which luminance decreases partially (including nonluminescent element), and it occurs when a top electrode has a hole. In addition, the shrink is phenomenon in which luminance degrades from a pixel end part (edge).

The development has done on a display device having a structure which prevents the above degradations of an EL element. There is a method for storing an EL element in an airtight vessel to confine the EL element within an enclosed space and further providing drying agent in the enclosed space with isolating from the EL element (for example, see Patent Reference 1).

(Patent Reference 1)
Japanese published unexamined application Hei 9-148066

In addition, there is a method for forming a sealing agent on an insulator where an EL element is formed and filling an enclosed space surrounded by a cover agent and the sealing agent with filler including resin and the like to be shut out from an outer part (for example, see Patent Reference 2).

(Patent Reference 2)
Japanese published unexamined application Hei 13-203076

According to the above patent references, a sealing agent is formed on an insulator where an EL element is formed thereon. Then, an enclosed space is formed, which is surrounded by the sealing agent and a cover agent by using the sealing agent. This sealing step is conducted in an inert gas atmosphere; therefore, there is a minute amount of moisture and oxygen in an inner part of a display device in the immediate aftermath of the sealing, not a large amount of moisture and oxygen from the beginning.

That is, moisture that is to be a cause for a degradation such as a dark spot enters inside of a display device after sealing in many cases. In addition, an insulator and a cover agent are often metal or glass; therefore, moisture and oxygen enter from the sealing agent.

FIG. 1 is a top view of the EL display described in Patent Reference 2. Reference numeral 401 shown by a dotted line denotes a source side driving circuit; 402, a gate side driving circuit; 403, a pixel portion; and 409, an FPC (flexible print circuit). In addition, reference numeral 404 denotes a cover agent; 405, a first sealing agent; and 406, a second sealing agent. FIG. 27 is a cross-sectional view of a conventional EL display device like that of FIG. 1 (the second sealing agent 406 is not shown). As shown in FIG. 27, in a region A of a sealing region, an EL element is encapsulated in an inner portion by using a sealing agent.

According to Patent Reference 1 and Patent Reference 2 above, the sealing agent shuts the EL element off from external moisture like this manner in the region A of the sealing region of FIG. 27.

In the case of the structure in which an EL element is stored in an airtight vessel as described in Patent Reference 1, an EL display device grows in size by the size of the vessel. Moreover, the drying agent is arranged separately from the EL element to prevent a negative effect by stacking a drying agent (protective layer including the drying agent) directly on the EL element. Accordingly, the airtight vessel grows further in size. Although the size of the EL display device increases, the size of a light-emitting portion does not change. Here, an advantage of a thin shape is not taken, which is needlessness of a backlight of the EL display device. Further, in the structure of Patent Reference 1, there is a risk that moisture which enters the airtight vessel comes into contact with the EL element to lead a degradation of EL element because the drying agent absorbs moisture in the airtight vessel.

In Patent Reference 2, a filler such as resin shuts an EL element off from external moisture. However, increase in the size of the EL display device is inevitable because the sealing agent is applied to the region A in FIG. 27 to fabricate an enclosed space.

As described above, the area of a part which dose not emit light increases when a display device area except a pixel portion emitting light (region A in FIG. 27) is large. Accordingly, the increase in the size of the display device is required in order to obtain the same size of light-emitting portion.

In order to solve this problem, a method for applying a sealing agent onto an insulating layer such as an interlayer film and a protective film. FIG. 17 shows the EL display device above, and FIG. 2 shows an enclosed end part of a sealing region at an end. In FIG. 2, reference numeral 21 denotes a substrate; 22, a counter substrate; 23, a gate insulating film; 24 and 25, interlayer films; 26, a wiring; and 27, a sealing agent.

As shown in FIG. 2, in the sealing region, the gate insulating film 23 on the substrate 21, the interlayer films 24 and 25, and the wiring 26 are sequentially stacked, and the sealing agent 27 is applied on the insulating layer (laminated films). In this structure, it is possible to reduce the size of the region A in FIG. 27 which dose not emit light. FIG. 2 is an example; the materials of layers which are stacked on a TFT substrate side and the sequence of the laminated layer are not limited to this example. Here, as an example, a display device has a structure in which a base film, a gate insulating film, a protective film, an interlayer film and a wiring are sequentially stacked on a glass substrate and which has the wiring on the top of those films.

However, in the case where a sealing agent for sealing is on a laminated films as shown in FIG. 2, all of the laminated films are exposed directly to the atmosphere outside of the panel. Accordingly, moisture and oxygen which are outside of the panel enter through the laminated films into the display device. Further, in the case that a material having high moisture permeability such as acrylic is used as the interlayer film, the moisture and the oxygen which enter further increase.

Moisture and oxygen enters from this acrylic serving as the interlayer film and top and bottom interfaces of the acrylic, and reach the interlayer film adjoining to an EL element through a disconnecting part due to inferior film formation of a source and drain electrodes in a contact hole. Accordingly, various degradations such as contamination of the inner part of the display device, a degradation of electric properties, a dark spot and shrink are caused.

Therefore, an object of the present invention is to provide an EL display device of high reliability and its manufacturing method by preventing moisture and oxygen, the factors for degrading properties of an EL element, from entering without increasing the size of the EL display device.

SUMMARY OF THE INVENTION

In a sealing region at an end part of a display device, the present invention prevents contaminated materials such as moisture and oxygen outside of a display device from entering an inner part of the display device by shutting the inner part of the display device off from an outer part by using a film which forms the display device. In the present specification, a protective film which protects a light-emitting element from contaminated materials by shutting the inner part of a display device off from the outer part is referred to as a sealing film.

A display device according to the present invention, comprising a display unit formed by arranging a light-emitting element using an organic light-emitting material between a pair of substrates,
wherein the display unit is formed over an insulating layer formed on either one of the substrate,
wherein the pair of substrates are formed outside of the display unit so as to surround a periphery of the display unit and are attached to each other by a sealing agent formed on the insulating layer,
wherein at least one layer of the insulating layer is formed from an organic resin material, and
wherein an outer end part of the insulating layer located outside of the sealing agent is covered with a sealing film.

A display device according to the present invention, comprising a display unit formed by arranging a light-emitting element using an organic light-emitting material between a pair of substrates,
wherein the display unit is formed over an insulating layer formed on either one of the substrate,
wherein the pair of substrates is formed outside of the display unit so as to surround a periphery of the display unit and are attached to each other by a sealing agent formed on the insulating layer,
wherein at least one layer of the insulating layer is formed from an organic resin material,
wherein the insulating layer have an opening to be covered with a sealing film, and
wherein the sealing agent is formed adjoining to the sealing film.

A display device according to the present invention, comprising a display unit formed by arranging a light-emitting element using an organic light-emitting material between a pair of substrates,
wherein the display unit is formed over an insulating layer formed on either one of the substrate,
wherein the pair of substrates is formed outside of the display unit so as to surround a periphery of the display unit and are attached to each other by a sealing agent formed on the insulating layer,
wherein at least one layer of the insulating layer is formed from an organic resin material,
wherein the insulating layer have an opening to be covered with a sealing film, and
wherein an outer end part of the insulating layer located outside of the sealing agent is covered with the sealing film.

A display device according to the present invention, comprising a display unit formed by arranging a light-emitting element using an organic light-emitting material between a pair of substrates,
wherein the display unit is formed over an insulating layer formed on either one of the substrate,
wherein the pair of substrates is formed outside of the display unit so as to surround a periphery of the display unit and are attached to each other by a sealing agent formed on the insulating layer,
wherein at least one layer of the insulating layer is formed from an organic resin material,
wherein the insulating layer has plural openings to be covered with a sealing film, and
wherein the sealing agent is formed adjoining to the sealing film.

A display device according to the present invention, comprising a display unit formed by arranging a light-emitting element using an organic light-emitting material between a pair of substrates,
wherein the display unit is formed over an insulating layer formed on either one of the substrate,
wherein the pair of substrates is formed outside of the display unit so as to surround a periphery of the display unit and are attached to each other by a sealing agent formed on the insulating layer,
wherein at least one layer of the insulating layer is formed from an organic resin material,
wherein the insulating layer has plural openings to be covered with a sealing film, and
wherein an outer end part of the insulating layer located outside of the sealing agent is covered with a sealing film.

According to the structures above, the insulating layer may have plural openings to be covered with a sealing film, the openings may be provided at any place in an inner part of the display device. The openings may be sealed between a pixel portion and a peripheral driving circuit, and also may be sealed in a sealing region. However, an outer end part of the insulating layer located outside of the sealing agent needs to be covered with a sealing film. Therefore, in the case where an opening is located outside of a sealing agent, the outer end part may be an opening as shown in FIG. 4.

According to the structures above, a film including one or plural kinds of films selected from a conductive thin film and an insulating thin film may be used as the sealing film. As a conductive thin film, a film including one or plural kinds of elements selected from Al, Ti, Mo, W and Si may be used. As an insulating thin film, a film including one or plural kinds of films selected from a silicon nitride film, a silicon nitride oxide film or a nitrogen-containing carbon film may be used.

According to the structures above, a film including one or plural kinds of materials selected from the group consisting of acrylic, polyamide and polyimide can be used for the organic resin material. In addition, the organic resin material may be formed from a material in which a skeletal structure is formed by bonding of silicon and oxygen. As the material in which a skeletal structure is formed due to bonding of silicon and oxygen, siloxanic polymer is cited as a typical example. Specifically, it is a material wherein a skeletal structure is formed by bonding of silicon and oxygen and wherein a substituent includes at least hydrogen, or a material wherein a substituent includes at least one from the group consisting of fluorine, alkyl and aromatic hydrocarbon.

A method for manufacturing a display device according to the present invention, including a display unit formed by arranging a light-emitting element using an organic light-emitting material between a pair of substrates, comprising the steps of:

forming the display unit over an insulating layer formed on either one of the substrate;

forming the pair of substrates outside of the display unit so as to surround a periphery of the display unit to be attached to each other by a sealing agent formed on the insulating layer;

forming at least one layer of the insulating layer from an organic resin material; and covering an outer end part of the insulating layer located outside of the sealing agent with a sealing film.

A method for manufacturing a display device according to the present invention, including a display unit formed by arranging a light-emitting element using an organic light-emitting material between a pair of substrates, comprising the steps of:

forming the display unit over an insulating layer formed on either one of the substrate;

forming the pair of substrates outside of the display unit so as to surround a periphery of the display unit to be attached to each other by a sealing agent formed on the insulating layer;

forming at least one layer of the insulating layer from an organic resin material;

forming an opening in the insulating layer to be covered with a sealing film; and forming the sealing agent to be adjoining to the sealing film.

A method for manufacturing a display device according to the present invention, including a display unit formed by arranging a light-emitting element using an organic light-emitting material between a pair of substrates, comprising the steps of:

forming the display unit over an insulating layer formed on either one of the substrate;

forming the pair of substrates outside of the display unit so as to surround a periphery of the display unit to be attached to each other by a sealing agent formed on the insulating layer;

forming at least one layer of the insulating layer from an organic resin material;

forming an opening in the insulating layer to be covered with a sealing film; and covering an outer end part of the insulating layer located outside of the sealing agent with a sealing film.

A method for manufacturing a display device according to the present invention, including a display unit formed by arranging a light-emitting element using an organic light-emitting material between a pair of substrates, comprising the steps of:

forming the display unit over an insulating layer formed on either one of the substrate;

forming the pair of substrates outside of the display unit so as to surround a periphery of the display unit to be attached to each other by a sealing agent formed on the insulating layer;

forming at least one layer of the insulating layer from an organic resin material;

forming plural openings on the insulating layer to be covered with a sealing film respectively; and forming the sealing agent to be adjoining to the sealing film.

A method for manufacturing a display device according to the present invention, including a display unit formed by arranging a light-emitting element using an organic light-emitting material between a pair of substrates, comprising the steps of:

forming the display unit over an insulating layer formed on either one of the substrate;

forming the pair of substrates outside of the display unit so as to surround a periphery of the display unit to be attached to each other by a sealing agent formed on the insulating layer;

forming at least one layer of the insulating layer from an organic resin material;

forming plural openings in the insulating layer to be covered with a sealing film respectively; and covering an outer end part of the insulating layer located outside of the sealing agent with a sealing film.

According to the structures above, the insulating layer may have plural openings to be covered with a sealing film, and the openings may be provided at any place in an inner part of a display device. The openings may be sealed between a pixel portion and a peripheral driving circuit, and also may be sealed in a sealing region. However, an outer end part of the insulating layer located outside of the sealing agent needs to be covered with a sealing film. Therefore, in the case where an opening is located outside of a sealing agent, the outer end part may be an opening as shown in FIG. 4.

According to the structures above, the sealing film may be formed of one or plural kinds of films selected from a conductive thin film and an insulating thin film. A conductive thin film may be formed of one or plural kinds of elements selected from the group consisting of Al, Ti, Mo W and Si. An insulating thin film may be formed of one or plural kinds of films selected from a silicon nitride film, a silicon nitride oxide film or a nitrogen-containing carbon film.

According to the structures above, the organic resin material can be formed from one or plural kinds of materials selected from the group consisting of acrylic, polyamide and polyimide. In addition, the organic resin material may be formed from a material in which a skeletal structure is formed by bonding of silicon and oxygen. As the material in which a skeletal structure is formed due to the bonding of silicon and oxygen, siloxanic polymer is cited as a typical example. Specifically, it is a material wherein a skeletal structure is formed due to the bonding of silicon and oxygen and wherein a substituent includes at least hydrogen, or a material wherein a substituent includes at least one from the group consisting of fluorine, alkyl and aromatic hydrocarbon.

By providing a sealing film according to the present invention, an interlayer insulating film including an organic material of the display device (panel) is no longer exposed directly to the atmosphere outside of the display device. Therefore, it becomes possible to prevent moisture and oxygen outside of the display device from entering an inside of the display device through an insulating film and the like including a hygroscopic organic material. In addition, various degradations such as contamination of an inner part of the display device caused by moisture and oxygen, the degradation of electric properties, a dark spot and shrink can be prevented to enhance reliability of the display device. Moreover, a display device of high reliability can be manufactured without increasing manufacturing steps because a film forming a display device is used as a sealing film (protective film) in the present invention.

EFFECT OF THE INVENTION

By adopting the structures of the present invention, the effect as shown below can be obtained.

By providing a sealing film, an interlayer insulating film including an organic material of the display device (panel) is no longer exposed directly to the atmosphere outside of the display device. Therefore, it becomes possible to prevent moisture and oxygen outside of the display device from entering an inside of the display device through an insulating film and the like including a hygroscopic organic material. Accordingly, various degradations such as contamination of an inner part of the display device caused by moisture and oxygen, the degradation of electric properties, a dark spot and shrink can be prevented to enhance reliability of the display device.

In addition, a display device of high reliability can be manufactured without increasing manufacturing steps because a film made of the same material as that of a film forming the display device is formed at the same time to be used for a sealing film.

A display device formed like above obtains sufficient operation properties and reliability, because of having a structure in which contaminated materials are shut off in a sealing region in an end part of the display device. Accordingly, an electric appliance using a display device of the present invention also obtains high reliability.

BRIEF DESCRIPTION OF THE DRAWINGS

FIGS. 7A–7C are cross-sectional views showing the steps of manufacturing an active matrix substrate;

FIGS. 8A–8C are cross-sectional views showing the steps of manufacturing an active matrix substrate;

FIGS. 12A–12F are views showing examples of a display device;

DETAILED DESCRIPTION OF THE PRESENTLY PREFERRED EMBODIMENTS (Embodiment Mode 1)

Referring to the figures, an embodiment mode of the present invention will be described in detail.

Figure 3:
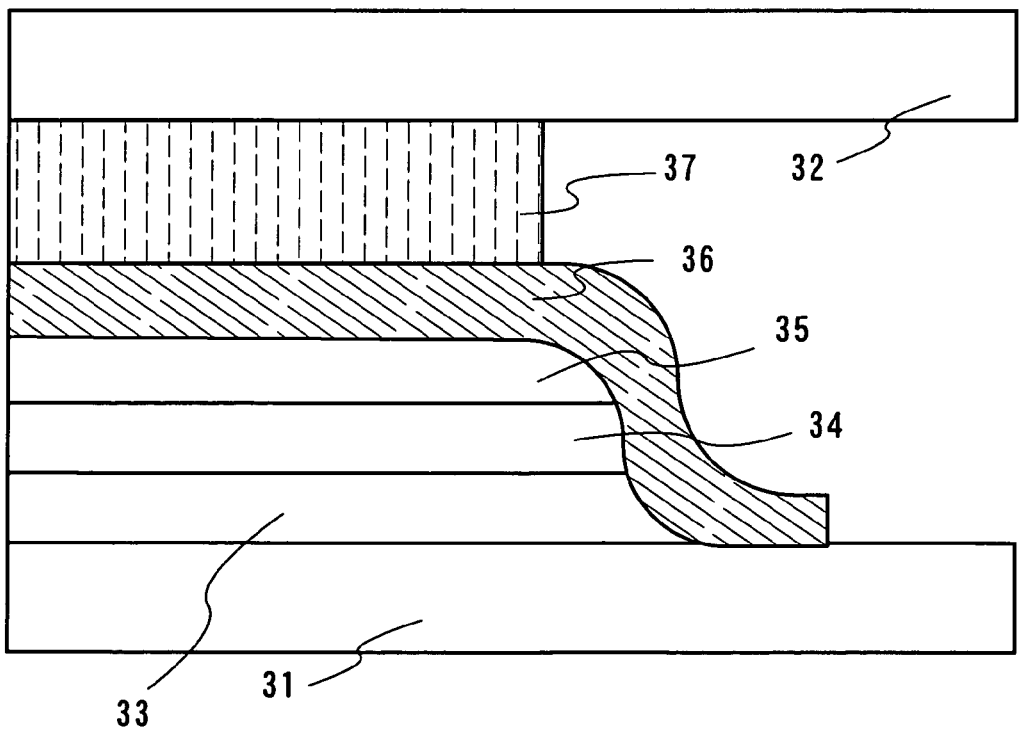
FIG. 3 is a view showing a structure according to the present invention.

In a sealing region of a display device, a gate insulating film, an interlayer film and a wiring, which are over a TFT substrate, are stacked to form an insulating layer. In FIG. 3, reference numeral 31 denotes a substrate; 32, a counter substrate; 33, an insulating film; 34 and 35 interlayer films; 36, a sealing film serving as a protective film; 37, a sealing agent. The lamination in FIG. 3 is an example; materials of layers stacked on a TFT substrate side and a sequence of the lamination are not limited to this example. Here, as an example, a display device has a structure in which a base film (not shown in the figure), a gate insulating film, a protective film, an interlayer film and a sealing film are stacked on a glass substrate, having the sealing film on the top of those films.

As described above, to reduce the area of display device except nonluminescent pixel portion, the sealing agent is applied onto the laminated insulating layer, attached to the substrate including the insulating layer and to the counter substrate. As shown in FIG. 3, the present embodiment mode has a structure wherein the sealing film stacked on the top is formed from the same material as that of the wiring at the same time, covering the base film (not shown in the figure), the gate insulating film, the interlayer film, the protective film and so on which have been formed in advance.

By this sealing film, a film such as the interlayer film no longer is exposed to the atmosphere outside of the display device. Therefore, it becomes possible to prevent moisture and oxygen outside of the display device from entering the inner part of the display device through the interspace between films. Accordingly, the reliability of the display device can be enhanced by preventing various degradations caused by moisture and oxygen such as contamination of an inner part of the display device, the degradation of electric properties, a dark spot and shrink. Moreover, in the present invention, a display device with high reliability can be manufactured without increasing the manufacturing steps because a film made of the same material as that of a film which forms the display device is used for a sealing film.

The sealing film which shuts moisture and oxygen off serves as a protective film, therefore, it is preferable that the sealing film has a dense structure.

In addition, a film including one or plural kinds of films selected from a conductive thin film and an insulating thin film may be used as the sealing film. As a conductive thin film, a film including one element selected from the group consisting of Al, Ti, Mo, W and Si, or an alloy film including the plural elements may be used. As an insulating thin film, a film including one or plural kinds of films selected from a silicon nitride film, a silicon nitride oxide film or a nitrogen-containing carbon film can be used.

In addition, acrylic, polyamide, polyimide and the like can be used for an organic resin material employed for the insulating film, and the organic resin material is not limited to these materials. Further, a material wherein a skeletal structure is formed by bonding of silicon and oxygen can be used for the organic resin material. As the material in which a skeletal structure is formed due to the bonding of silicon and oxygen, siloxanic polymer is cited as a typical example. Specifically, a material is cited, wherein a skeletal structure is formed due to the bonding of silicon and oxygen and wherein a substituent includes at least hydrogen, or a material wherein a substituent includes at least or one of the group consisting of fluorine, alkyl and aromatic hydrocarbon.

Figure 5A:
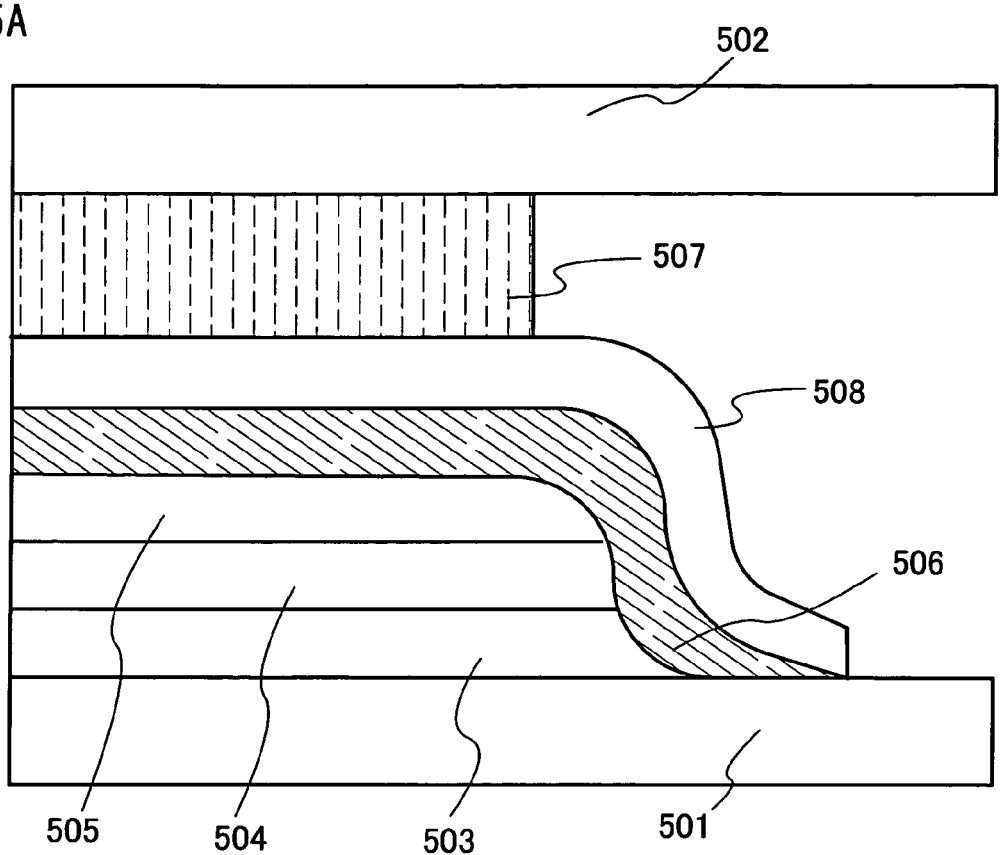
FIGS. 5A–5B are views showing a structure of the present invention.
Figure 5B:
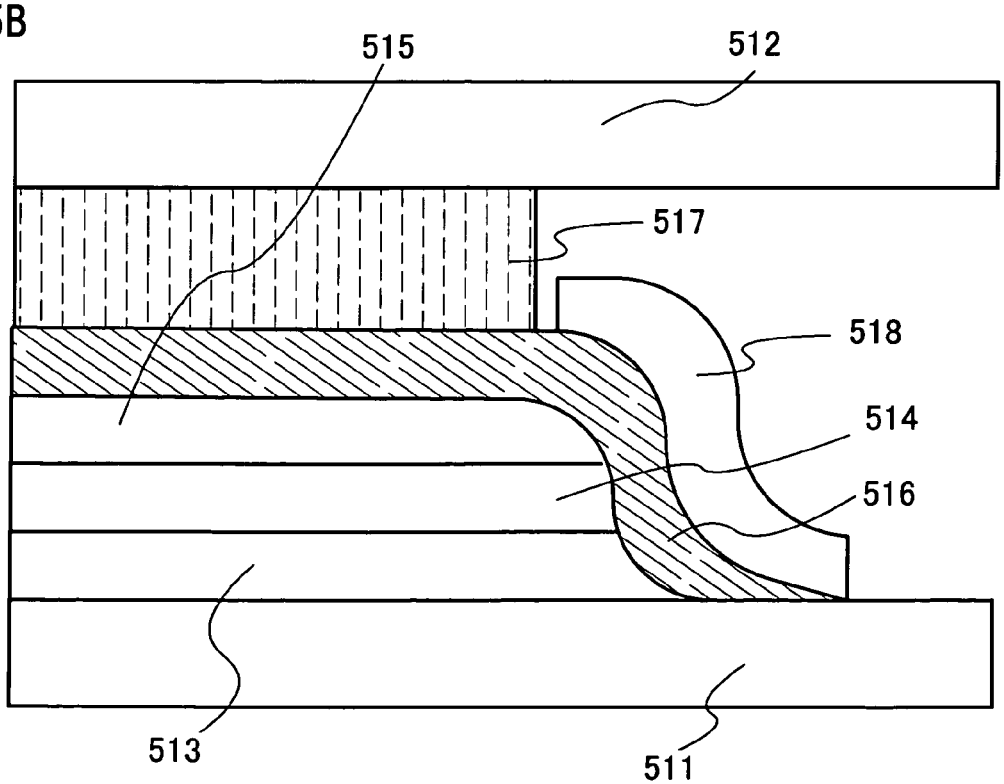

Further, as shown in FIGS. 5, two or more layers of sealing film as well as single layer of the sealing film may be provided. In the case of covering with a conductive film, as shown in FIG. 5(B), the conductive film is required to be stacked only in a sealing region being separated from an inner region of the display device in order to prevent short circuit and the like in an inner part of the display device. The blocking effect is further improved when the sealing film is stacked in an end part of the display device to shut off like this manner, compared to that of the case of using a single layer sealing film.

As shown in a side view of FIG. 3, a film in a lower layer to be covered is preferred to make an inclined plane have a form with a curvature radius varying continuously (smooth) in the case of covering with a sealing film, because a thin film in an upper layer is formed continuously. In the case where the surface of the inclined plane of a film in the lower layer is not smooth, the sealing film reduces its thickness on the surface of the film in the lower layer to be broken. The broken film cannot block contaminated materials sufficiently, thereby making the present invention less effective. In addition, when the surface of the lower layer film to be covered is smooth, the good coverage of the sealing film to be formed thereon is obtained. Consequently, the effectiveness of the present invention is improved. Therefore, it is preferable to conduct wet etching by using a photosensitive material as a lower layer film, because of the decrease in rough parts on a film surface and the improve in surface smoothness.

As described above, a display device with high reliability, can be obtained which blocking contaminated materials which becomes a factor for a degradation without increasing a display device area except a nonluminant pixel portion.

(Embodiment Mode 2)

An embodiment mode of the present invention is described in detail with reference to the figures.

Figure 4:
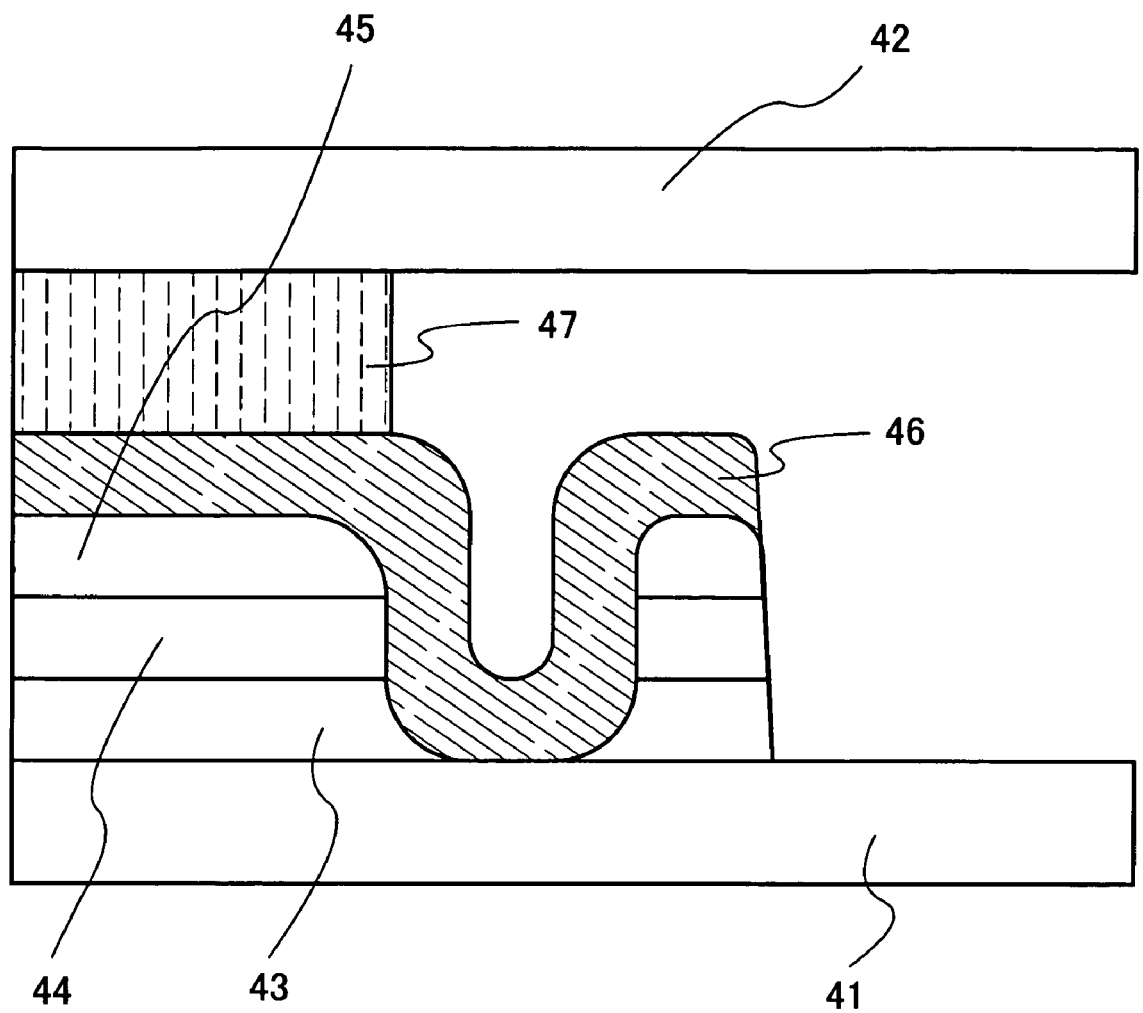
FIG. 4 is a view showing a structure according to the present invention.

In a sealing region of a display device, an insulating film, an interlayer film and a wiring over a TFT substrate are stacked to form an insulating layer. In FIG. 4, reference numeral 41 denotes a substrate; 42, a counter substrate; 43, an insulating film; 44 and 45, interlayer films; 46, a sealing film which serves as a protective film; 47, a sealing agent. The lamination in FIG. 4 is an example; materials of a film stacked on a TFT substrate side and a sequence of the lamination are not limited to this example. Here, as an example, a display device has a structure in which an base film (not shown in the figure), an insulating film, a protective film, and an interlayer film are stacked on a glass substrate, having the sealing film on the top of those films.

As described before, a sealing agent is applied onto the laminated insulating layer and attaches the substrate including the insulating layer to the counter substrate in order to reduce the area of a panel area except a pixel portion. As shown in FIG. 4, the present embodiment mode has a structure wherein openings are provided in an insulating substrate, an inter layer film, a protective film and the like, forming the sealing film at the opening so as to cover the laminated films. This sealing film is formed from the same material as that of the wiring at the same time with the formation of the wiring.

By this sealing film, the insulating layer including an organic resin material and the like below the sealing film is divided into an inner side region and an outer side region in the display device. Those films in an inner side region of the display device are not exposed directly to the atmosphere outside of display device. Therefore, moisture and oxygen outside of the display device are blocked by the sealing film and cannot enter the inside of the display device even in the case where the insulating layer in the outer region of the display device is exposed to the atmosphere, and where the moisture and oxygen outside of the display device go through the interlayer film and interspace between the films to enter the panel. Therefore, it is possible to prevent various degradations which are caused by moisture and oxygen such as contamination of an inner part of the display device, the degradation of electric properties, a dark spot and shrink. Accordingly, reliability of the display device can be improved. In addition, reliability of the display device to be manufactured can be improved without increasing manufacturing steps because the sealing film is formed from the same material as that of the film which forms the display device at the same time.

The sealing film which blocks moisture and oxygen serves as a protective film, therefore, it is preferable that the sealing film has a dense structure.

In addition, a film including one or plural kinds of films selected from a conductive thin film and an insulating thin film may be used as the sealing film. As the conductive thin film, a film such as a film including one element or alloy film including plural elements selected from the group consisting of Al, Ti, Mo, W and Si may be used. As the insulating thin film, a film including one or plural kinds of films selected from a silicon nitride film, a silicon nitride oxide film or a nitrogen-containing carbon film can be used.

Moreover, acrylic, polyamide and polyimide can be used for the organic resin material used for the insulating layer, and the organic resin material is not limited to these materials. In addition, the organic resin material may be formed from a material in which a skeletal structure is formed by bonding of silicon and oxygen. As the material in which a skeletal structure is formed due to the bonding of silicon and oxygen, siloxanic polymer is cited as a typical example. Specifically, a material wherein a skeletal structure is formed due to the bonding of silicon and oxygen and wherein a substituent includes at least hydrogen, or a material wherein a substituent includes at least one from a group consisting of fluorine, alkyl and aromatic hydrocarbon.

In addition, a structure in which a sealing film may divide a multilayer film in the inner part of the display device, and a structure in which the sealing film covers an end part of the panel as described in Embodiment Mode 1 are acceptable. The multilayer film may be divided plural times and at any place in an inner part of the display device. Therefore, the multilayer film may be divided between a pixel region and a peripheral driving circuit region, and it may be divided in a sealing region.

The insulating layer may be provided with plural openings to be covered with a sealing film, and the openings may be provided at any place in the inner part of the display device. The openings may be sealed between the pixel region and the peripheral driving circuit region, and also may be sealed in the sealing region. However, an external end part of the insulating layer that is located outside of the sealing agent needs to be covered with the sealing film. Accordingly, in the case where the opening is located outside of a sealing agent, the external end part may be the opening as shown in FIG. 4.

Further, in FIG. 4 of the present embodiment mode, the opening is formed so as to reach a glass substrate; however the structure of the present invention is not limited to that. That is, it is enough if the insulating film including a hygroscopic organic material is covered with a sealing film. Therefore, the openings may be formed to reach a film which is usable as a sealing film such as a silicon nitride film and the openings may be covered with the sealing film.

In addition, as shown in FIGS. 5, two or more layers of sealing film as well as one layer of the sealing film may be formed. In FIG. 5(A), reference numeral 501 denotes a substrate; 502, a counter substrate; 503, insulating films; 504 and 505, interlayer films; 506 and 508, sealing films serving as a protective film; and 507, a sealing agent. In this case, in order to prevent short circuit and the like occurring inside of the display device, a sealing film is formed apart from the inner region of the display device to be stacked on a sealing region alone as shown in FIG. 5(B) when a conductive film is used for the sealing film. In FIG. 5(B), reference numeral 511 denotes a substrate; 512, a counter substrate; 513, an insulating film; 514 and 515, interlayer films; 516 and 518, sealing films serving as a protective film; and 517, a sealing agent. Like this manner, the contaminated materials are blocked by increasing the number of dividing in an inner part of the display device, being combined with the structure covering an end part, and stacking films at the end part of the display device. Accordingly, the blocking effect on contaminated materials is further improved compared to the case of using the single layer of the sealing film.

The present embodiment mode can be combined with Embodiment Mode 1 freely.

As described above, a display device with high reliability which blocks contaminated materials such as moisture and oxygen to be a factor for degradation without increasing an area of the display device except a nonluminescent pixel portion.

(Embodiment)

[Embodiment 1]

The present embodiment describes a method for manufacturing an active matrix substrate with reference to FIGS. 6 to 9. Although an active matrix substrate has plural TFTs, the method for manufacturing the active matrix substrate is described by using a case of having a driving circuit portion including an n-type channel TFT and a p-type TFT, and having a pixel portion.

As a base film 300, a silicon nitride oxide film is formed on a substrate 200 having an insulating surface in a thickness of 10 to 200 nm (preferably 50 to 100 nm) by a plasma CVD method. A hydrogenated silicon nitride oxide film is then stacked thereon in a thickness of 50 to 200 nm (preferably 100 to 150 nm). In the present embodiment, a 50-nm-thick silicon nitride oxide film and a 100-nm-thick hydrogenated silicon nitride film are formed by a plasma CVD method. As the substrate 200, a glass substrate, a quartz substrate, a silicon substrate, a metal substrate or stainless substrate having an insulating film on its substrate may be used. In addition, a plastic substrate having a heat resistance may be used, which enables to resist a processing temperature of the present embodiment. Moreover, a flexible substrate may be used for the substrate 200. Further, a double layer structure and a structure where single layer or two or more layers of the undercoat (insulating) films are stacked may be used as the base film.

Figure 6A:
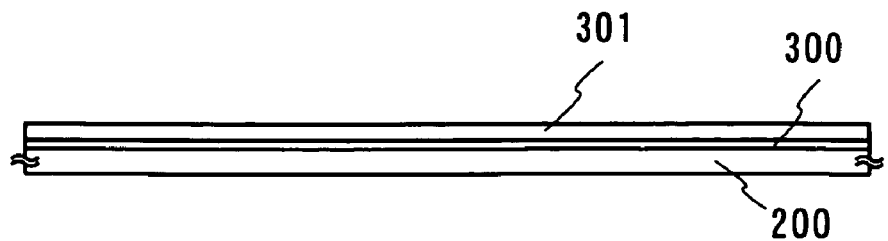
FIGS. 6A–6D are cross-sectional views showing the steps of manufacturing an active matrix substrate.
Figure 6B:
Figure 6C:
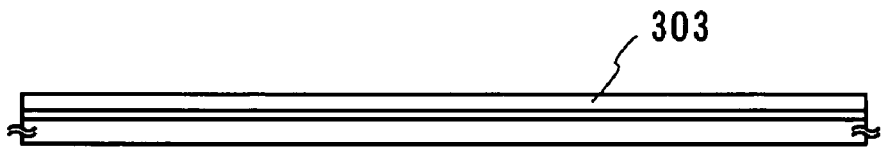
Figure 6D:
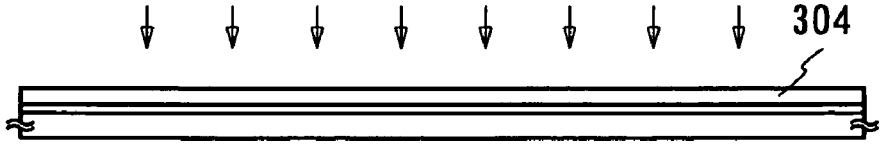

Next, a semiconductor film 301 is formed on a base film (FIG. 6(A)). A semiconductor film may be formed in a thickness of 25 to 200 nm (preferably 30 to 150 nm) by well-known means (sputtering method, LPCVD method, plasma CVD method or the like). Although materials of the semiconductor film is not limited, the semiconductor film is preferably formed from silicon, a germanium-silicon (SiGe) alloy or the like. The amorphous silicon film is processed by a thermal crystallization method and a laser crystallization method using a metal element which promotes crystallization.

In the present embodiment, an amorphous silicon film is formed in a thickness of 54 nm by a plasma CVD method as the semiconductor film. Nickel is used as a metal element and introduced onto the amorphous silicon film by a solution application method. As for the method for introducing a metal element to an amorphous silicon film, there is no particular limitation as long as it is a method by which the metal element exists on the surface or inside of the amorphous silicon film. For example, a sputtering method, a CVD method, a plasma processing method (including a plasma CVD method), an absorption method and a method for applying a metal salt solution may be used. Among these, the method using a solution is simple and convenient, and it is useful in that control on a concentration of a metal element is easy. In addition, in order to improve surface wettability and to spread a solution over an entire surface of the amorphous silicon film, it is preferable to form an oxide film by UV light irradiation under oxygen atmosphere, a thermal oxidization method and a processing by ozone moisture including hydroxy radical, hydrogen peroxide solution or the like.

A thermal treatment is conducted at a temperature from 500 to 550° C., for 8 to 20 hours, to crystallize the amorphous silicon film. In the present embodiment, nickel is used as the metal element, and a metal-containing layer 302 is formed to introduce the metal element onto the amorphous silicon film 301. Four-hour-thermal treatment is then conducted at 550° C. to obtain a first crystalline silicon 303 (FIGS. 6(B) and 6(C)).

Next, the first crystalline silicon film 303 is irradiated by a laser beam to induce crystallization, and a second crystalline silicon film 304 is obtained. The semiconductor film is irradiated by a laser beam by a laser crystallization method. The laser to be used is preferably a solid-state laser, a gas laser and a metal laser of a continuous oscillation type. As the solid-state laser, there are a YAG laser, a $YVO_4$, a YLF laser, a $YAlO_3$ laser, a glass laser, a ruby laser, an alexandrite laser, Ti: sapphire laser and the like of a continuous oscillation type. As the gas laser, there are an Ar laser, a Kr laser, a $CO_2$ laser and the like of a continuous oscillation type. As the metal laser, a helium-cadmium laser, a cupper vapor laser and a metal vapor laser of a continuous oscillation type are cited. Moreover, an excimer laser of continuous emission type can be adopted. The laser beam may be converted to a higher harmonic wave by a nonlinear optical element. Excellent conversion efficiency is obtained when crystals called LBO, BBO, KDP, KTP, KB5 and CLBO are used for the nonlinear optical element, for example. Conversion efficiency can be increased drastically by putting these nonlinear optical elements into a laser oscillator. The laser of a higher harmonic wave is generally doped with Nd, Yb, Cr and the like. The excitation of Nd, Yb, Cr and the like induce laser oscillation. An operator may select appropriate types of dopant. As the semiconductor film, an amorphous semiconductor film, a microcrystal semiconductor film, a crystalline semiconductor film and the like are cited, and a compound semiconductor film having an amorphous structure such as an amorphous silicon germanium film and an amorphous silicon carbide film may be applied.

Thus obtained crystalline semiconductor film 304 is patterned by a photolithography method to form semiconductor layers 305 to 308.

In addition, after forming the semiconductor layers 305 to 308, a minute amount of impurity element (boron or phosphorus) may be doped in order to control a threshold value of a TFT.

Next, a gate insulating film 309 covering the semiconductor layers 305 to 308 is formed. The gate insulating film 309 is formed of an insulating film including silicon by a plasma CVD method or a sputtering method. At this time, the thickness of the gate insulating film 309 is set to be 40 to 150 nm. In the present embodiment, a 115-nm-thick silicon nitride oxide film is formed by a plasma CVD method. Of course, the gate insulating film is not limited to a silicon nitride oxide film, therefore, another insulating film of single layer structure or a double layer structure may be used.

Next, a first conductive film of 20 to 100 nm film thickness and a second conductive film of 100 to 400 nm film thickness are stacked to be formed on the gate insulating film. The first conductive film and the second conductive film may be formed from an element selected from the group consisting of Ta, W, Ti, Mo, Al and Cu, an alloy material or a compound material including the elements as a major component. Moreover, as the first conductive film and the second conductive film, a semiconductor represented by polycrystalline silicon film doped with impurity element such as phosphorus and AgPdCu alloy may be used. Not limited to the film having a double layer structure, a triple layer structure may be employed, in which a 50-nm-thick tungsten film, a 500-nm-thick alloy film of aluminum and silicon (Al—Si) and a 30-nm-thick titanium nitride film are stacked sequentially for example. In the case of using the triple layer structure, tungsten nitride may be used instead of tungsten of the first conductive film, and an alloy film of aluminum and titanium (Al—Ti) may be used instead of the alloy film of the aluminum and silicon (Al—Si) in the second conductive film. In addition, a titanium film may be used instead of the titanium nitride film in the third conductive film. Also, a single layer structure may be used. In this embodiment, a 30-nm-thick tantalum nitride film 310 and 370-nm-thick tungsten film 311 are formed in sequential lamination on the gate insulating film 309 (FIG. 7(A)).

Next, masks 312 to 316 made of resist are formed by using a photolithography method to conduct a first etching treatment in order to form an electrode and a wiring. Using an ICP (Inductively Coupled Plasma) etching method, etching conditions (electric energy to be applied to a coil shaped electrode, electric energy to be applied to a substrate side electrode, a temperature of the electrode on a substrate side and the like) is properly controlled. Accordingly, the first conductive film and the second conductive film can be etched into a desired tapered shape. As an gas used for etching, a chlorine gas typified by $Cl_2$, $BCl_3$, $SiCl_4$, $CCl_4$ and the like, a fluorine gas typified by $CF_4$, $SF_6$, $NF_3$ and the like, and $O_2$ can be suitably used.

By the first etching treatment, conductive layers 317 to 321 of a first shape made of the first conductive layer and the second conductive layer (first conductive layers 317a to 321a and second conductive layers 317b to 321b) are formed (FIG. 7(B)).

Next, a second etching treatment is conducted without removing a mask made of resist. Here, a W film is etched selectively. The second conductive layers 322b to 326b are formed by the second etching treatment at this time. On the other hand, the first conductive layers 322a to 326a are hardly etched to form the conductive layers 322 to 326 of a second shape.

A first doping treatment is then conducted without removing a mask made of resist to add a low-concentration impurity element which imparts an n-type to a semiconductor layer. The doping treatment may be conducted by an ion doping method or an ion implantation method. As an impurity element imparting an n-type, a Group 15 element such as phosphorus (P) or arsenic (As) are typically used, but phosphorus (P) is used at this time. In this case, the conductive layers 322 to 326 serve as a mask with respect to impurities imparting an n-type, and impurity regions 327 to 330 are formed in a self-aligning manner. An impurity element imparting an n-type is doped into the impurity regions 327 to 330 in a concentration of from $1\times10^{18}$ to $1\times10^{20}$/cm$^3$ (FIG. 7(C)).

After removing the mask made of resist, masks 331a to 331c made of resist are newly formed to conduct a second doping treatment at a higher accelerating voltage than that of the first doping treatment. The doping treatment is conducted so as to add an impurity element to a lower semiconductor layer in the tapered part of the first conductive layer, by using the second conductive layers 323b and 326b as a mask with respect to the impurity element. A third doping treatment is then conducted to obtain a state of FIG. 8(A) at a lower accelerating voltage than that of the second doping treatment. By the second and the third doping treatments, an impurity element imparting an n-type is doped with low-concentration impurity regions 335 and 341 which overlaps with the first conductive layer in a concentration of from $1\times10^{18}$ to $5\times10^{19}$/cm$^3$, and an impurity element imparting an n-type is doped with high-concentration impurity regions 334, 337 and 340 in a concentration of from $1\times10^{19}$ to $5\times10^{21}$/cm$^3$.

As a matter of fact, by setting a proper accelerating voltage, a low-concentration impurity region and a high-concentration impurity region can be formed by one time of doping treatment of the second and third doping treatment.

Next, after removing a mask made of resist, masks 342a and 342b made of resist are newly formed to conduct a fourth doping treatment. By the fourth doping treatment, impurity regions 343, 344, 347 and 348 are formed in which an impurity element imparting a conductivity type which is opposite to that of the first conductivity type is doped with a semiconductor layer to be served as an active layer of a p-channel type TFT. By using the first conductive layer and the second conductive layer 322 and 326 are used as a mask with respect to an impurity element, an impurity element imparting a p-type is doped to form an impurity region in a self-aligning manner. In the present embodiment, the impurity regions 343, 344, 347 and 348 are formed by an ion doping method using diborane ($B_2H_6$)(FIG. 8(B)). In the fourth doping treatment, a semiconductor layer forming an n-channel type TFT is covered with the masks 342a and 342b made of resist. By the first to third doping treatments, phosphorus is doped into impurity regions 332, 340 and 341 in different concentrations respectively. By conducting doping treatment so as that the concentration of the impurity element imparting a p-type is from $1\times10^{19}$ to $5\times10^{21}$ atoms/cm$^3$ in each of the regions, there arises no problem because the impurity regions serves as a source and drain region of a p-channel type TFF.

By the above-mentioned steps, an impurity region is formed in each of the semiconductor films.

Next, the masks 342a and 342b made of resist are removed to form a first interlayer insulating film 349. The first interlayer insulating film 349 is formed of an insulating film which includes silicon in a thickness of 100 to 200 nm by using a plasma CVD method or a sputtering method (FIG. 8(C)). In the present embodiment, silicon nitride oxide film in a film thickness of 150 nm is formed by a plasma CVD method. Of course, the first interlayer insulating film 349 is not limited to a silicon nitride oxide film, and an insulating film including different silicon of a single layer structure or a double layer structure may be employed.

Next, in order to activate the impurity elements, a heat treatment, intense-light irradiation, or laser beam irradiation is conducted. Besides the activation, it is possible to recover plasma damage to a gate insulating film and plasma damage to an interface between the gate insulating and a semiconductor layer at the same time.

A second interlayer insulating film 350 including an inorganic insulating film material or an organic insulator film material is formed on the first interlayer insulating film 349. A 1.6-μm-thick acrylic resin film is formed in the present embodiment, and the acrylic resin film with viscosity of 10 to 1000 cp, preferably 40 to 200 cp is used. In addition, a material in which a skeletal structure is formed by bonding of silicon and oxygen may be used. As the material in which a skeletal structure is formed by bonding of silicon and oxygen, siloxanic polymer is cited as a typical example. Specifically, a material wherein a skeletal structure is formed due to the bonding of silicon and oxygen and wherein a substituent includes at least hydrogen, or a material wherein a substituent includes at least one from the group consisting of fluorine, alkyl and aromatic hydrocarbon. On the second interlayer insulating film 350, a passivation film 351 including the nitride insulating film (typically, a silicon nitride film, silicon nitride oxide film and nitride containing carbon film (CN)) is formed.

A metal film is then formed to be etched, and a source and drain electrodes and respective wirings (not shown in the figures) which are electrically connected to each of the impurity regions are formed. For the metal film, a film including an element such as aluminum (Al), titanium (Ti), molybdenum (Mo), tungsten (W) or silicon (Si), or an alloy film using these elements may be employed. In the present embodiment, a titanium film, an alloy film of titanium and aluminum and a titanium film (Ti, Al—Si and Ti) are stacked to have a thickness of 100, 350 and 100 nm respectively, after that, those films are patterned and etched to form source electrode and drain electrodes 352 and each of the wirings (not shown in the figures). Accordingly, a p-channel type TFT 11 and an n-channel type TFT 12 are formed in peripheral circuit portion 1, and an n-channel type TFT 13 and a p-channel type TFT 14 are formed in a pixel portion 2.

According to the present invention, the wiring may be formed so as to cover up a film in a lower layer at an end part of the substrate that serves as a sealing region. When the wiring is formed, a film including the same material as that of the wiring is used as a sealing film. It is enough if the light-emitting element is not exposed to the external atmosphere. Therefore, Embodiment Mode 1, Embodiment Mode 2, or combination of those may be used for sealing the end part.

By this sealing film, the insulating layer such as the interlayer film no longer is exposed to the atmosphere outside of the display. Therefore, it becomes possible to prevent moisture and oxygen outside of the display device from entering the inner part of the display device through the insulating layer and interspace between films. Accordingly, the reliability of the display device can be enhanced by preventing various degradations caused by moisture and oxygen such as contamination of an inner part of the display device, the degradation of electric properties, a dark spot and shrink. Moreover, in the present invention, a display device with high reliability can be manufactured without increasing the manufacturing steps because a film using the same material as that of a film which forms the display device is used for a sealing film.

Figure 9:
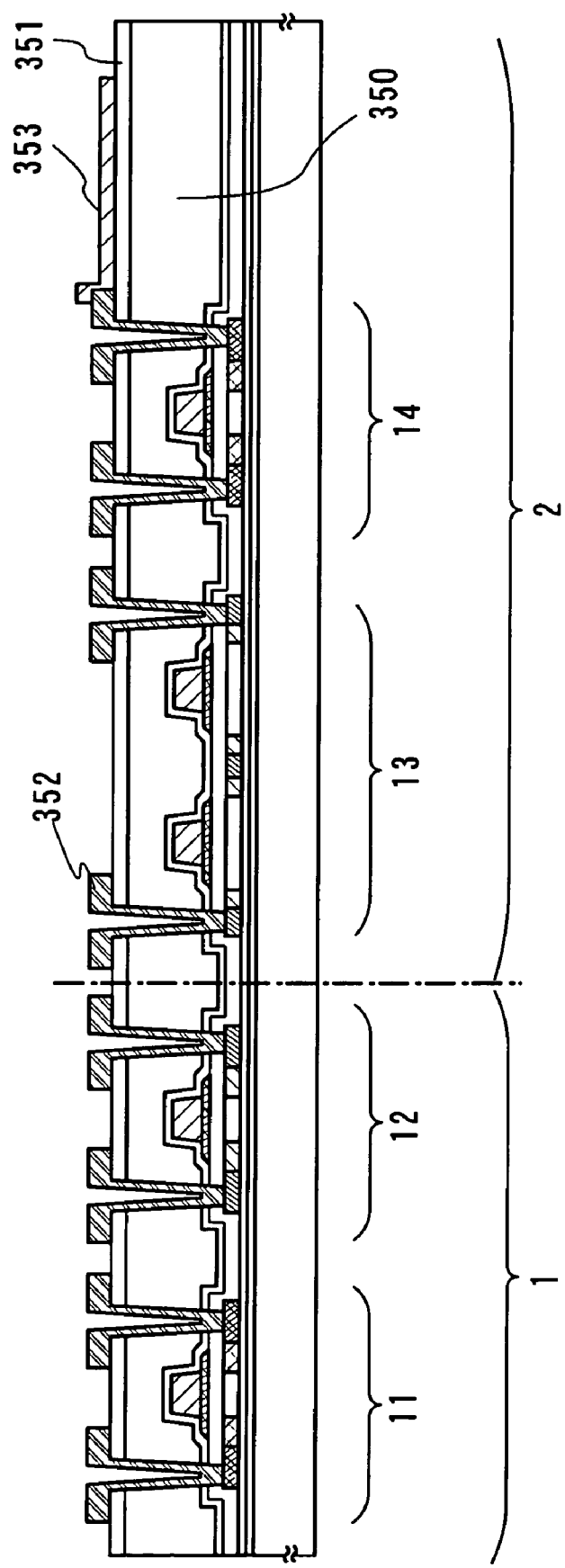
FIG. 9 is a cross-sectional view showing an active matrix substrate.

An electrode (an anode or a cathode in the case of an EL display device, or a pixel electrode in the case of a liquid crystal display device) is then formed. Transparent conductive films such as ITSO, ITO, $SnO_2$ including indium tin oxide and silicon oxide can be used for the electrode, and a metal film such as Al can be used in the case of a reflective liquid crystal display device. In the present embodiment, an electrode 353 is formed by forming ITO to be etched into a desired shape (FIG. 9).

By the steps above, an active matrix substrate having a TFT is completed.

The present invention is not limited to the method for forming a TFT of top-gate type (planer type) shown in the present embodiment. The present invention can be applied to a bottom-gate type (inversely staggered type), a dual-gate type having two gate electrodes arranged above and below of a channel region with two gate insulating films interposed therebetween, and other structures.

[Embodiment 2]

The present embodiment describes an example of a method for manufacturing a display device by using a method for manufacturing a TFT, which is shown in Embodiment 1, when an active matrix substrate is formed. In the present specification, a display device refers generically to a display panel in which a light-emitting element formed on a substrate is sealed between the substrate and a cover agent, and a display module in which a TFT is incorporated in the display panel. The light-emitting element includes a layer having an organic compound (light-emitting layer) from which luminescence (Electro Luminescence) can be obtained by applying an electric field, an anode layer and a cathode layer. In addition, as for the luminescence of an organic compound, there are light-emission (fluorescence) which occurs when the organic compound returns to a ground state from a singlet excitation state, and light-emission (phosphorescence) which occurs when the organic compound returns to a ground state from a triplet excitation state. An EL material applicable for the present invention includes all light-emitting materials emitting a light through the singlet excitation and the triplet excitation and the both the types of excitation.

In the present specification, all the layers formed between an anode and a cathode in a light-emitting element is defined as an organic light-emitting layer. Specifically, the organic light-emitting layer includes a light-emitting layer, a hole-injection layer, an electron-injection layer, a hole-transport layer, an electron-transport layer and the like. In general, a light-emitting element has a structure in which an anode layer, a light-emitting layer and a cathode layer are stacked sequentially. Besides this structure, the light-emitting element has a structure in which an anode layer, a hole-injection layer, a light-emitting layer, a cathode layer and the like are stacked sequentially, and a structure in which an anode layer, a hole-injection layer, a light-emitting layer, an electron-transport layer, an cathode layer and the like are stacked sequentially in some cases.

Figure 11:
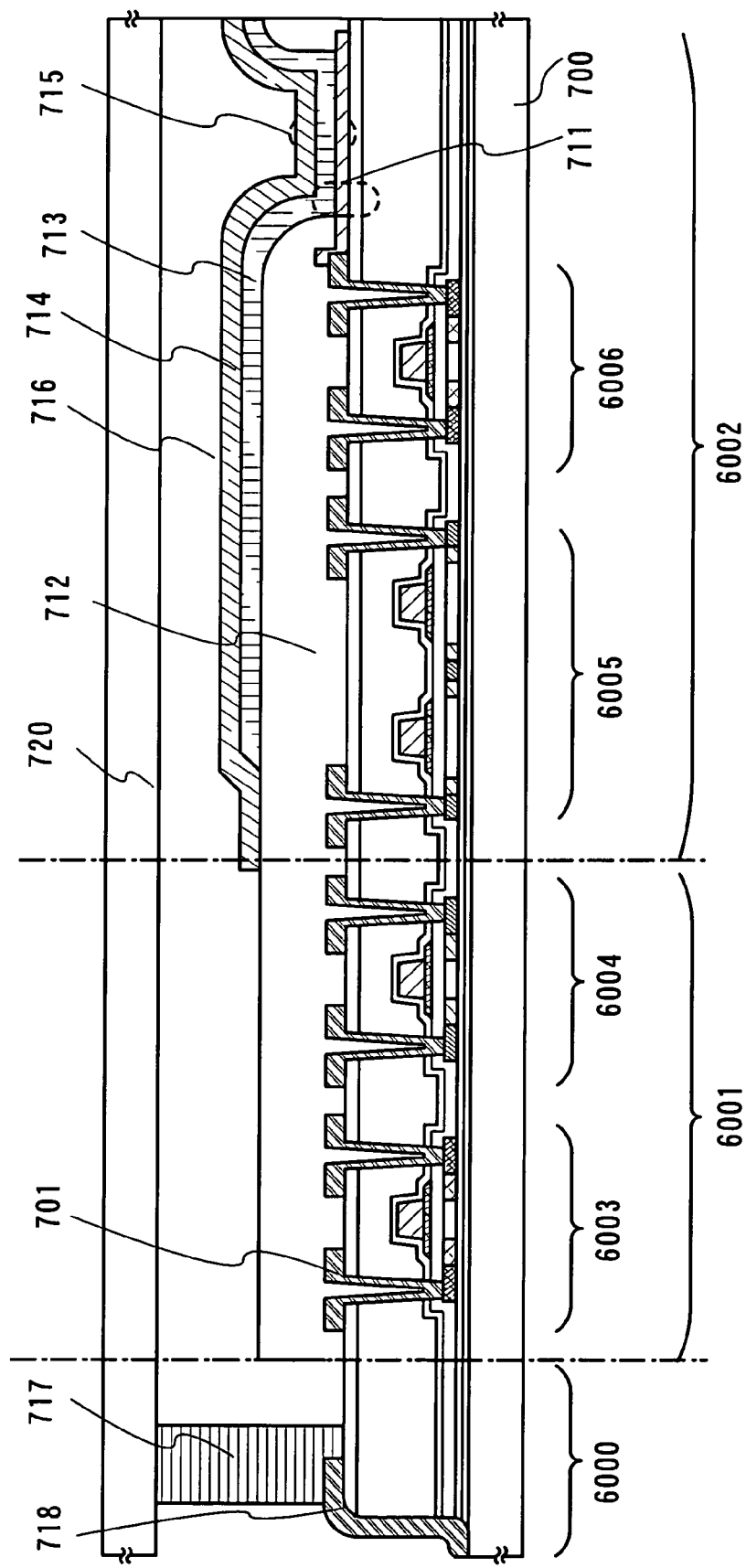
FIG. 11 is a cross-sectional view showing a display device of the present invention.

FIG. 11 is a cross-sectional view of a display device of the present embodiment. In FIG. 11, a p-channel type TFT 6003 and an n-channel type TFT 6004 are formed in a peripheral circuit portion 6001, and an n-channel type TFT 6005 and a p-type channel TFT 6006 are formed in a pixel region 6002, which are encapsulated in a sealing region 6000. Although the present embodiment may employ a double gate structure in which two channel-forming regions are formed, a single gate structure in which a single channel-forming region is formed and a triple gate structure in which three channel-forming regions are formed may be used.

A driving circuit provided on a substrate 700 is formed by using a CMOS circuit in FIG. 9. Accordingly, it is possible to use the description on the n-channel type TFT 11 and the p-channel type TF12 as a reference. Although a single gate structure is used in the present embodiment, a double gate structure or a triple gate structure may be used.

Moreover, reference numeral 711 denotes a pixel electrode (an anode of a light-emitting element) including a transparent conductive film. As the transparent conductive film, a compound of indium oxide and tin oxide, a compound of indium oxide and zinc oxide, a zinc oxide, a tin oxide and an indium oxide can be used. Further, a film formed by adding gallium to the transparent conductive film. The pixel electrode 711 may be formed on a flat interlayer insulating film before forming the wiring. It is effective to flatten steps due to a TFT by using a leveling film including a resin. Insufficient emitting due to the steps is likely to occur because a light-emitting layer formed later is very thin. Therefore, it is preferable to form the leveling film before forming the pixel electrode in order to form a light-emitting layer on a flat plane as far as possible.

After forming a wiring 701, a bank 712 is formed as shown in FIG. 11. The bank 712 may be formed by patterning an insulating film or an organic resin film which have 100 to 400-nm-thick silicon. In addition, a material in which a skeletal structure is formed by bonding of silicon and oxygen may be used. As the material in which the skeletal structure is formed by bonding of silicon and oxygen, siloxanic polymer is cited as a typical example. Specifically, the material wherein the skeletal structure is formed due to the bonding of silicon and oxygen and wherein a substituent includes at least hydrogen, or a material wherein a substituent includes at least one from the group consisting of fluorine, alkyl and aromatic hydrocarbon.

The bank 712 is an insulating film; therefore, damage by electro-static discharge in film formation needs attention. In the present embodiment, carbon particles and metallic particles are added to reduce electric resistivity, and static electricity is prevented from occuring. At this time, the amount of the carbon particles and the metallic particles to be added are controlled so as that the value of the electric resistivity is $1 \times 10^6$ to $1 \times 10^{12}$ Ωm (preferably $1 \times 10^8$ to $1 \times 10^{10}$ Ωm).

On the pixel electrode 711, a light-emitting layer 713 is formed. Although only one pixel is shown in FIG. 11, light-emitting layers responding to each color of R (red), G (green) and B (blue) is formed respectively. In addition, a low-molecular weight organic light-emitting material is formed by an evaporation method in the present embodiment. Specifically, laminated structure in which a 200-nm-thick copper phthalocyanine (CuPc) film is provided as a hole-injection layer, and a 700-nm-thick tris-8-quinolinolato aluminum complex ($Alq_3$) film is formed thereon as a light-emitting layer, is formed. A color of light-emission can be controlled by adding fluorescent dye such as quinacridon, perylene or DCM1 to $Alq_3$.

However, the example above is an example of an organic light-emitting material that can be used as a light-emitting layer, there is no need to limit the organic light-emitting material to the above mentioned example. The light-emitting layer (layer emitting light to transfer carriers for the light-emission) may be formed by combining the light-emitting layer, a charge-transporting layer or a charge-injecting layer freely. For example, the present embodiment shows the example that the low-molecular weight organic light-emitting material is used as the light-emitting layer. However, an intermediate-molecular weight organic light-emitting material and a high-molecular weight organic light-emitting material may be used. In the present specification, an organic material having no sublimability in which a number of molecules is no more than 20, or a length of molecular chains is no more than 10 μm is defined as an intermediate-molecular weight organic light-emitting material. Moreover, as an example of using a high-molecular weight organic light-emitting material, a laminated structure in which 20-nm-thick polythiophene (PEDOT) is provided as a hole-injecting layer by a spinning coating method and a 100-nm-thick polyparaphenylene vinylene (PPV) is provided thereon as a light-emitting layer may be used. In addition, when π-conjugated polymer of PPV is used, an emission wavelength can be selected from red color to blue color. Further, an inorganic material such as silicon carbide can be used as a charge-transporting layer and a charge-injecting layer. A well-known material can be used for these organic light-emitting material and inorganic material.

A cathode 714 made of a conductive film is then provided on the light-emitting layer 713. In the present embodiment, an alloy of aluminum and lithium is used as the conductive film. Of course a well-known MgAg film (an alloy film of magnesium and silver) may be used. As a cathode material, a conductive film including a Group 1 element or Group 2 element of the periodic table, or a conductive film in which those elements are added may be used.

When the cathode 714 is formed, a light-emitting element is completed. The light-emitting element 715 denotes a diode formed of the pixel electrode (anode) 711, the light-emitting layer 713 and the cathode 714.

It is effective to form a passivation film so as to cover the light-emitting element 715 completely (not shown in the figures). The passivation film is formed of an insulating film including a carbon film, a silicon nitride film, a nitrogen-containing carbon film (CN) or a silicon nitride oxide film. A single layer of the insulating film or the laminated layer of the combination of the insulating film is used as the passivation film.

At this time, it is preferable to use a film with good coverage as a passivation film, therefore, using a carbon film and particularly a DLC film are effective. The DLC film can be formed at a temperature from a room temperature to 100° C. or lower. Accordingly, the DLC film can be easily formed above the light-emitting layer 713 having inferior heat resistance. In addition, the DLC film has a high blocking effect, enabling a control on an oxidization of the light-emitting layer 713. Therefore, it is possible to prevent a problem such that the light-emitting layer 713 is oxidized while carrying out a sealing step afterward.

Moreover, a sealing agent 717 is formed on the passivation film, and a cover agent 720 is attached thereto. An ultraviolet curing resin may be used for the sealing agent 717, and it is effective to provide a hygroscopic material or an antioxidant material in an inner part. Furthermore, in the present embodiment, a glass substrate, a quartz substrate, a plastic substrate (including a plastic film) and a flexible substrate having a carbon film (preferably) on both sides are used. Except for the carbon film, an aluminum film (AlON, AlN, AlO and the like) and SiN can be used.

As described above, a display device having a structure shown in FIG. 11 is obtained. In addition, it is effective to conduct the steps continuously up to forming the passivation film (not shown in the figure) by using a film formation device of a multi-chamber system (or in-line system) without being exposed to the atmosphere. In addition, by developing the above further, it is possible to conduct continuously up to the step attaching the cover agent 720 without being exposed to the atmosphere.

Further, it is possible to form an n-channel type TFT of high resistant against the degradation due to a hot carrier by providing an impurity region overlapping with the gate electrode through an insulating film. Accordingly, a display device having high reliability can be realized.

Furthermore, the structure only of the pixel portion and the driving circuit is described in the present embodiment. However, by following the manufacturing steps of the present embodiment, a logic circuit such as a signal separation circuit, a D/A converter, an operation amplifier and a γ correction circuit can be formed on the same insulator. A memory and a microprocessor can be formed further.

In the present embodiment, in forming a wiring, a sealing film 718 is formed using the same material as that of the wiring at an end part of a substrate serving as a sealing region according to the present invention. The sealing film is formed so as to cover up (coat) a film in a lower layer. It is enough if the insulating layer, particularly an insulating film including a hygroscopic organic material is not exposed to the external atmosphere. Therefore, Embodiment Mode 1, Embodiment Mode 2, or the combination of those may be used for coating the end part and blocking, and the coating and the blocking are not limited to a structure in FIG. 11. Accordingly, the end part of the panel may be covered with the pixel electrode, the bank, the passivation film, the cathode and the like in a layer above the wiring. In the case of covering two or more layers, any combination of the films above may also be used.

Figure 20:
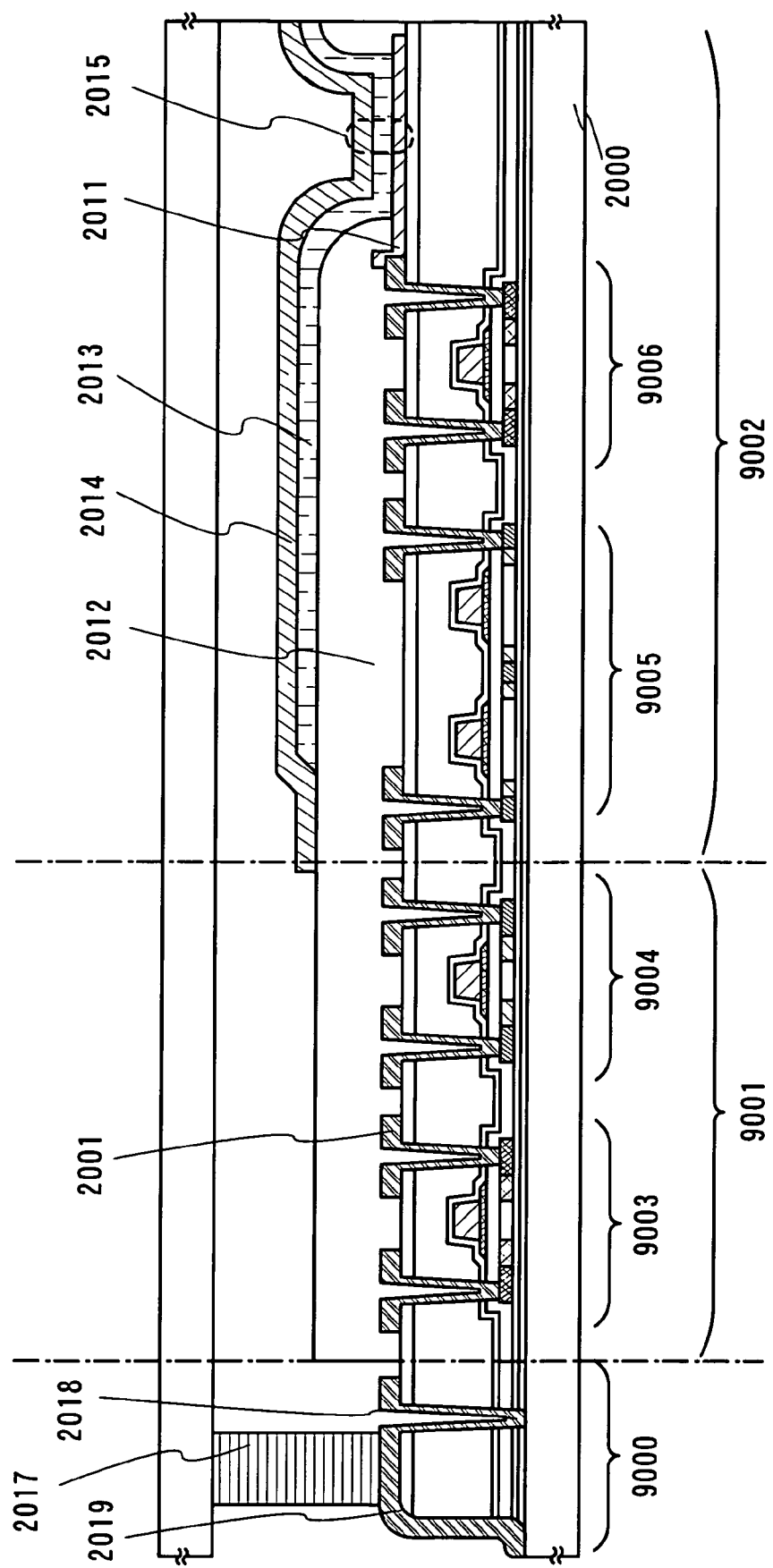
FIG. 20 is a cross-sectional view of a display device according to the present invention.
Figure 21:
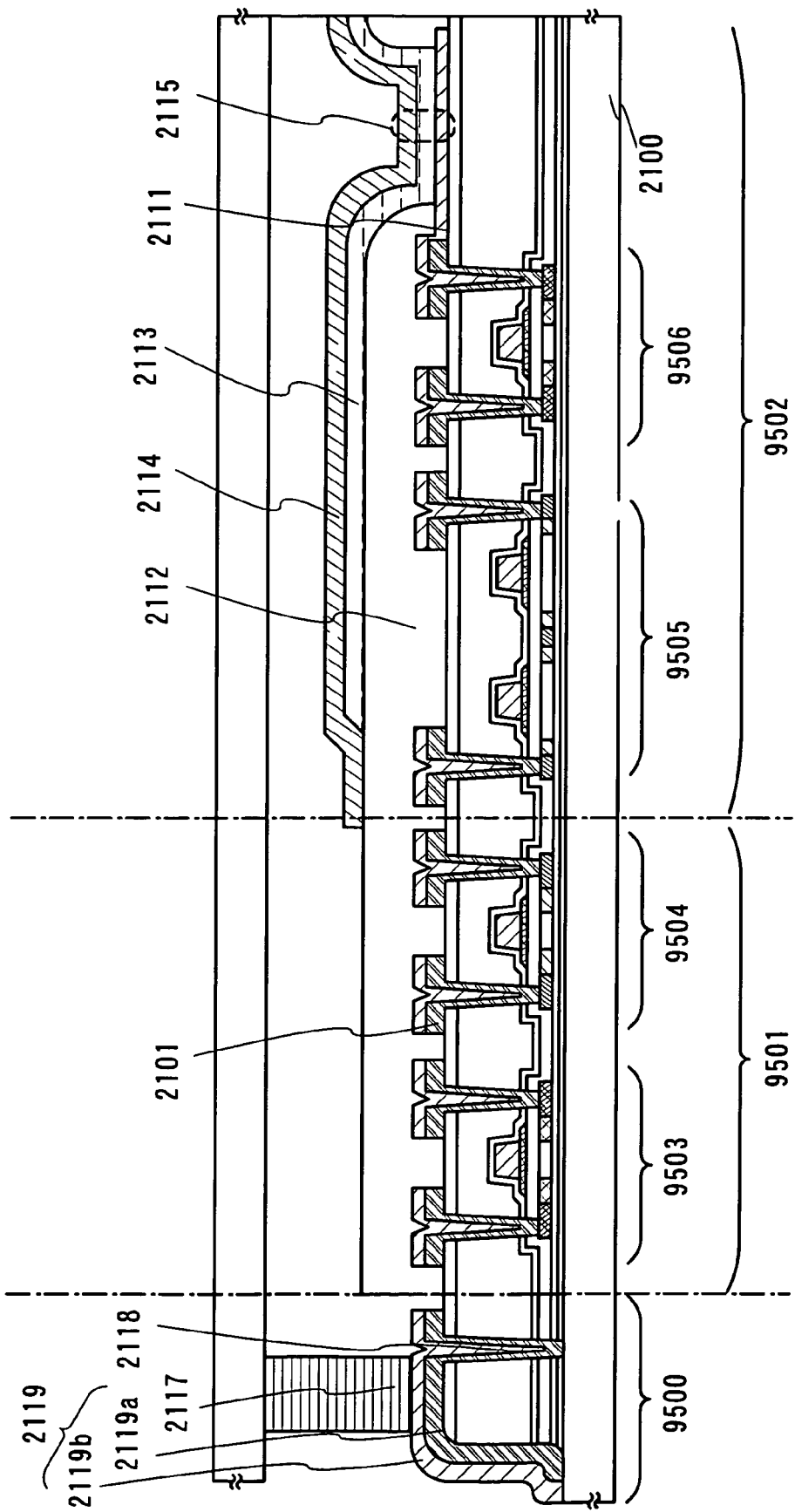
FIG. 21 is a cross-sectional view of a display device according to the present invention.

In addition, as shown in FIG. 4, a structure in which a sealing film is formed at opening to divide a film of a lower layer into an inner side region and an outer region in a display device and prevent contaminated materials from entering may also be used. FIG. 20 shows a structure in which a bare part of the insulating layer at the end part of the display device is covered with the sealing film formed from the same material as that of the wiring at the same time and in which the opening formed in the insulating layer is covered with the sealing film. In FIG. 20, reference numeral 9000 denotes a sealing region; 9001, a peripheral circuit portion; 9002, a pixel portion; 9003 and 9006, p-channel type TFTs; 9004 and 9005, n-channel type TFTs; 2000, a substrate; 2001, a wiring; 2011 and 2014, electrodes (anode or cathode); 2012, a bank; 2013, a light-emitting layer; 2015, a light-emitting element; 2018, an opening; 2019, a sealing film (protective film) covering the opening 2018 and side edge part; and 2017, a sealing agent. In the case of covering with a conductive film, the conductive film is formed apart from the inner region of the display device to be stacked on the sealing region alone in order to prevent short circuit inside and the like of the display device as shown in FIG. 5(B). Moreover, as shown in FIG. 4, the blocking effect on contaminated materials is further improved when a laminated sealing film is used for blocking the contaminated materials, compared to that of the case of using a single layer sealing film. FIG. 21 shows an example of using a film lamination structure of a film including the same material as that of a wiring and a film including the same material as that of an ITO as a sealing film. In FIG. 21, reference numeral 9500 denotes a sealing region; 9501, a peripheral circuit portion; 9502, a pixel portion; 9503 and 9506, p-channel type TFTs; 9504 and 9505, n-channel type TFTs; 2100, substrate; 2101, a wiring; 2111 and 2114, electrodes (anode or cathode), 2112, a bank; 2113, a light-emitting layer; 2115, a light-emitting element; 2118, an opening, 2119a and 2119b, a sealing film (protective film) covering the opening 2118 and side edge part; and 2117, a sealing agent.

Moreover, a display device with high reliability can be manufactured without increasing the manufacturing steps even though films forming the display device are used as a sealing film by any combination. However, the sealing film formed at outermost side to be exposed to the atmosphere including external moisture and moisture is required to have a dense structure which can block the moisture and oxygen. Although a sealing agent is formed in a part of the sealing film in FIGS. 20 and 21, it may be formed so as to cover the entire sealing film.

A display device having a conventional structure and a display device having a structure using the present embodiment are evaluated in their reliability. Here, a sealing film including the same material as that of a wiring is used employing the structure of Embodiment Mode 1.

Figure 15:
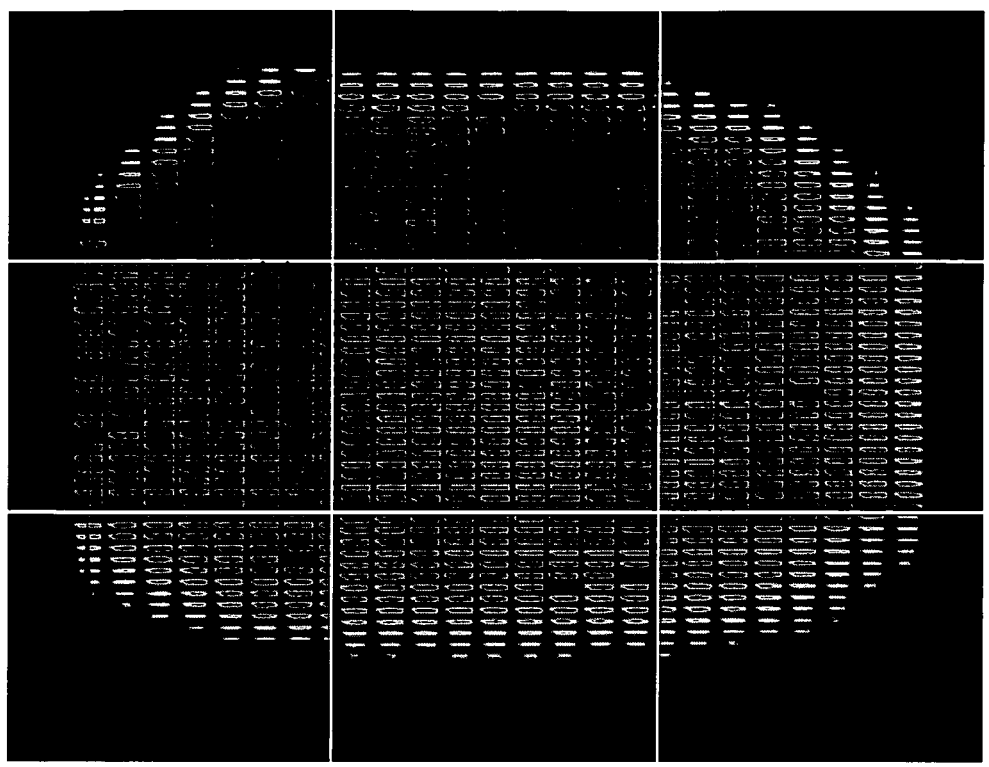
FIG. 15 is a view showing a result of a reliability evaluation of a conventional display device.
Figure 16:
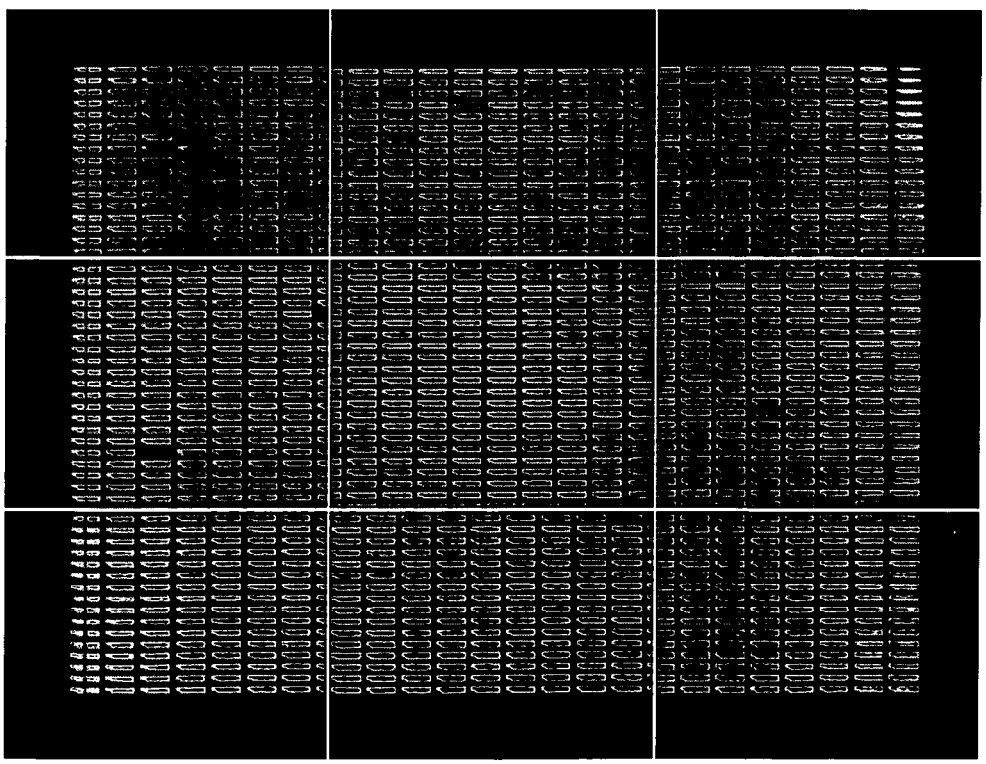
FIG. 16 is a view showing a result of a reliability evaluation of a display device according to the present invention.
Figure 17:
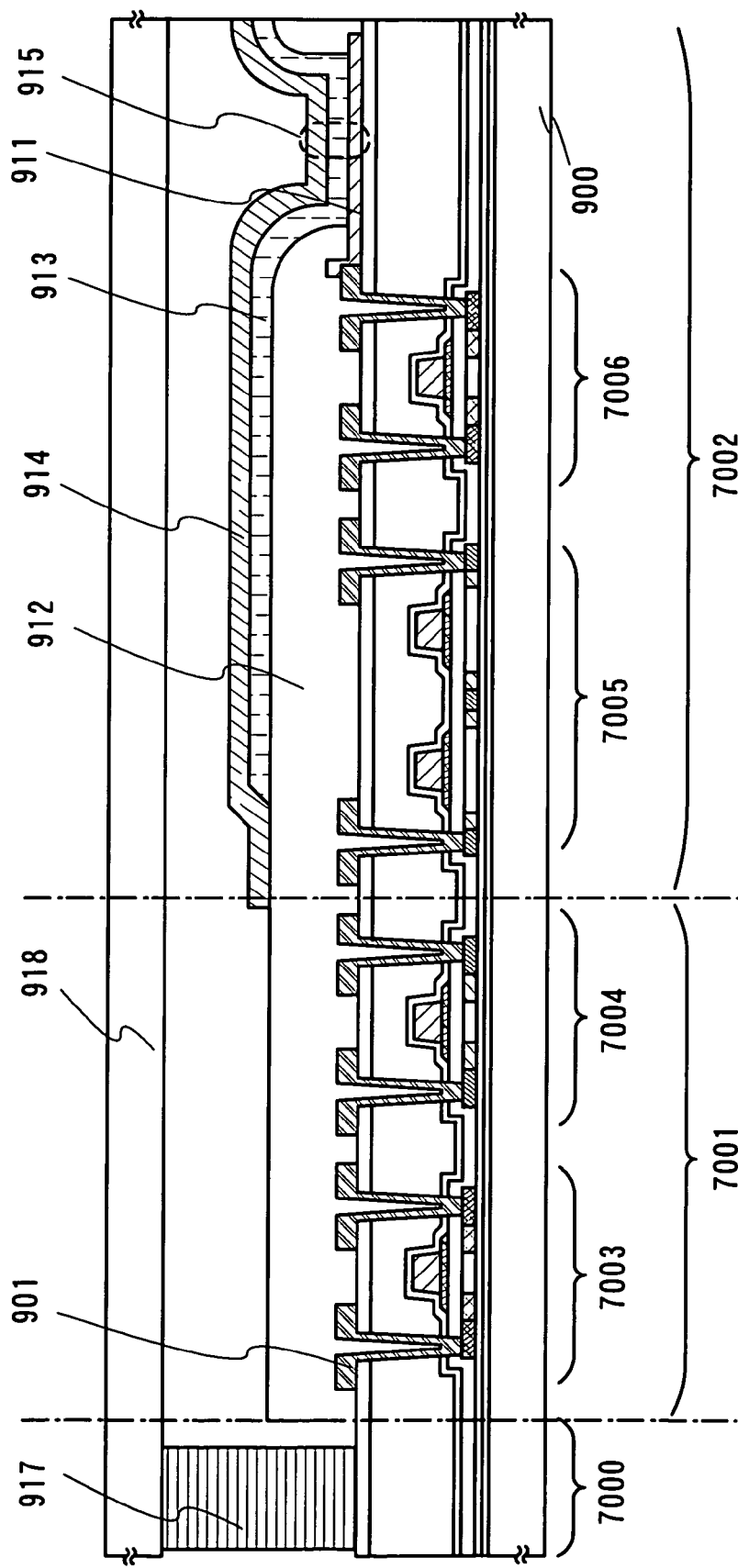
FIG. 17 is a cross-sectional view of a conventional EL display device.

In the reliability evaluation, change in luminance is examined by storing the display device at a temperature of 65° C., a humidity of 95% for 190 hours. FIG. 15 shows a light emission of the display device having a conventional structure, and FIG. 16 shows a light emission of the display device having a structure using the present embodiment. Each of the display devices are examined after being stored for 190 hours under the conditions above. Pictures in FIG. 15 and FIG. 16 show light emission of nine parts emitting a light respectively in a pixel region. FIGS. 15 and 16 respectively show light-emission after being stored for 190 hours under the conditions above of a display device having a conventional structure and a display device having a structure using the present embodiment.

As is apparent from FIG. 15, according to the display device having the conventional structure, nonluminescent region is spread from the end part of the display device to a center part. The phenomenon above is a degradation called shrink due to that contaminated materials such as moisture and oxygen enter the inner part of the display device. Compared to that, such degradation is hardly found in FIG. 16. This invention implies that the contaminated materials such as moisture and oxygen are shut off and cannot enter the inner part of the display device.

As for the display device having the structure according to the present embodiment, a film such as an interlayer film is no longer exposed directly to the atmosphere in the outside of the display device. Therefore, it becomes possible to prevent moisture and oxygen outside of the display device from entering though interspace between films into inner part of the display device. Accordingly, various degradations such as contamination of an inner part of the display device, the degradation of electric properties, a dark spot and shrink which are caused by moisture and oxygen can be prevented to make improvement in reliability of the display device possible. Moreover, in the present invention, a display device with high reliability can be manufactured without increasing the manufacturing steps because a film using the same material as that of a film which forms the display device is used for a sealing film.

A display device manufactured like this manner has a structure shutting contaminated materials off in a sealing region at an end part of the display device. Therefore, the operating characteristics and the reliability of the display device becomes sufficient. In addition, such display device can be used as a display unit of various electronics devices.

[Embodiment 3]

Figure 10:
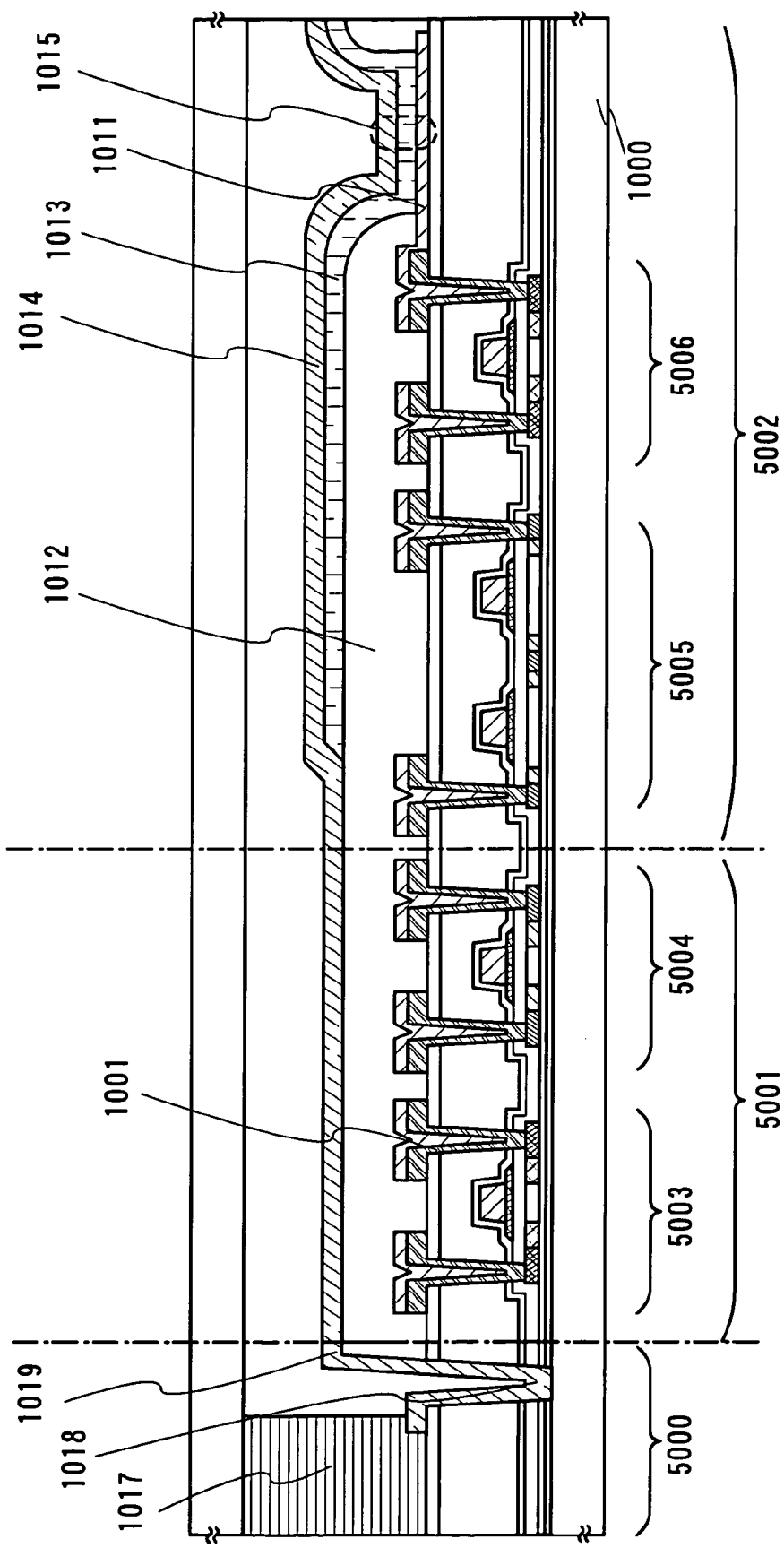
FIG. 10 is a cross-sectional view showing a display device of the present invention.

Referring FIG. 10, the present embodiment describes an example of a display device manufactured in embodiment 2, which has a different structure of a sealing film. Therefore, a part having the similar structure to that of Embodiment 2 may be manufactured by the method of Embodiment 2.

Also in the present embodiment, as Embodiment 2, a display device is manufactured by using a method for manufacturing a TFT in forming an active matrix substrate which is shown in Embodiment 1.

FIG. 10 is a cross-sectional view showing a display device of the present embodiment. In FIG. 10, reference numeral 5000 denotes a sealing region; 5001, a peripheral driving circuit; 5002, a pixel portion; 5003 and 5006, p-channel type TFTs; 5004 and 5005, n-channel type TFTs; 1000, a substrate; 1001, a wiring; 1011 and 1014, electrodes (anode or cathode); 1012, a bank; 1013, a light-emitting layer; 1015, a light-emitting element; 1018, an opening; 1019, a sealing film (protective film) covering the opening 1018 and the side end part; and 1017, a sealing agent.

In the present embodiment, the electrode 1011 includes a transparent conductive film. As the transparent conductive film, a compound of indium oxide and tin oxide, a compound of indium oxide and zinc oxide, a zinc oxide, a tin oxide and an indium oxide can be used. Further, a film formed by adding gallium to the transparent conductive film may be used.

As shown in FIG. 10, a film including the same material as that of the electrode 1011 may be formed on a source electrode and a drain electrode as a sealing film when the electrode 1011 is formed. Nonphotosensitive acrylic, photosensitive acrylic and an inorganic material can be used for an interlayer insulating film below the source electrode and the drain electrode. Dry etching is required in opening a contact on the interlayer film including a nonphotosensitive acrylic and inorganic material. A protrusion and depression are formed on an etched cross section by dry etching, which is likely to degrade film formation of the source and drain electrodes. By forming the sealing film on the source and drain electrodes as shown in FIG. 10, moisture and oxygen is prevented from entering from a disconnecting part (hole on a film). The disconnecting part is likely to be caused by the inferior film formation of the source electrode and the drain electrode. Accordingly, the degradation due to moisture and oxygen of an EL display device can be prevented.

The electrode 1014 including a conductive film is formed on the light-emitting layer 1013. In the case of the present invention, an alloy of aluminum and lithium is used as the conductive film. Of course, a well-known MgAg film (alloy film of magnesium and silver) may be used. As a cathode material, a conductive film including a Group 1 element or Group 2 element of periodic table, or a conductive film in which those elements are added may be used.

In the present embodiment, the sealing film 1019 is formed from the same material as that of the electrode 1014 in forming a cathode which is formed on the light-emitting layer 1013. The opening 1018 reaching up to the substrate is formed, and the sealing film 1019 then formed so as to cover the opening. A conductive film having a function of a cathode and a sealing film is formed continuously up to outside of a peripheral circuit to protect the EL element and the TFT inside. Accordingly, when moisture and oxygen enter through the interlayer film such as acrylic which is exposed to the external atmosphere, those moisture and oxygen can be shut off by the sealing film of the present invention. Therefore, the degradation of an EL display device due to moisture and oxygen can be prevented. Moreover, the electrode 1014 and the sealing film 1019 may be connected each other, and may also be formed separately by using a mask and the like.

In the present invention, although a film including the same material as that of a cathode is used, a passivation film may be formed on the cathode (a second electrode) to form the sealing film by the same steps and with the same material as those of the passivation film.

The present embodiment can be combined with Embodiment Mode 1 or 2, or any one of Embodiments 1 to 3, or the present embodiment can also be combined with plural from the embodiment modes and the embodiments above.

[Embodiment 4]

Figure 18:
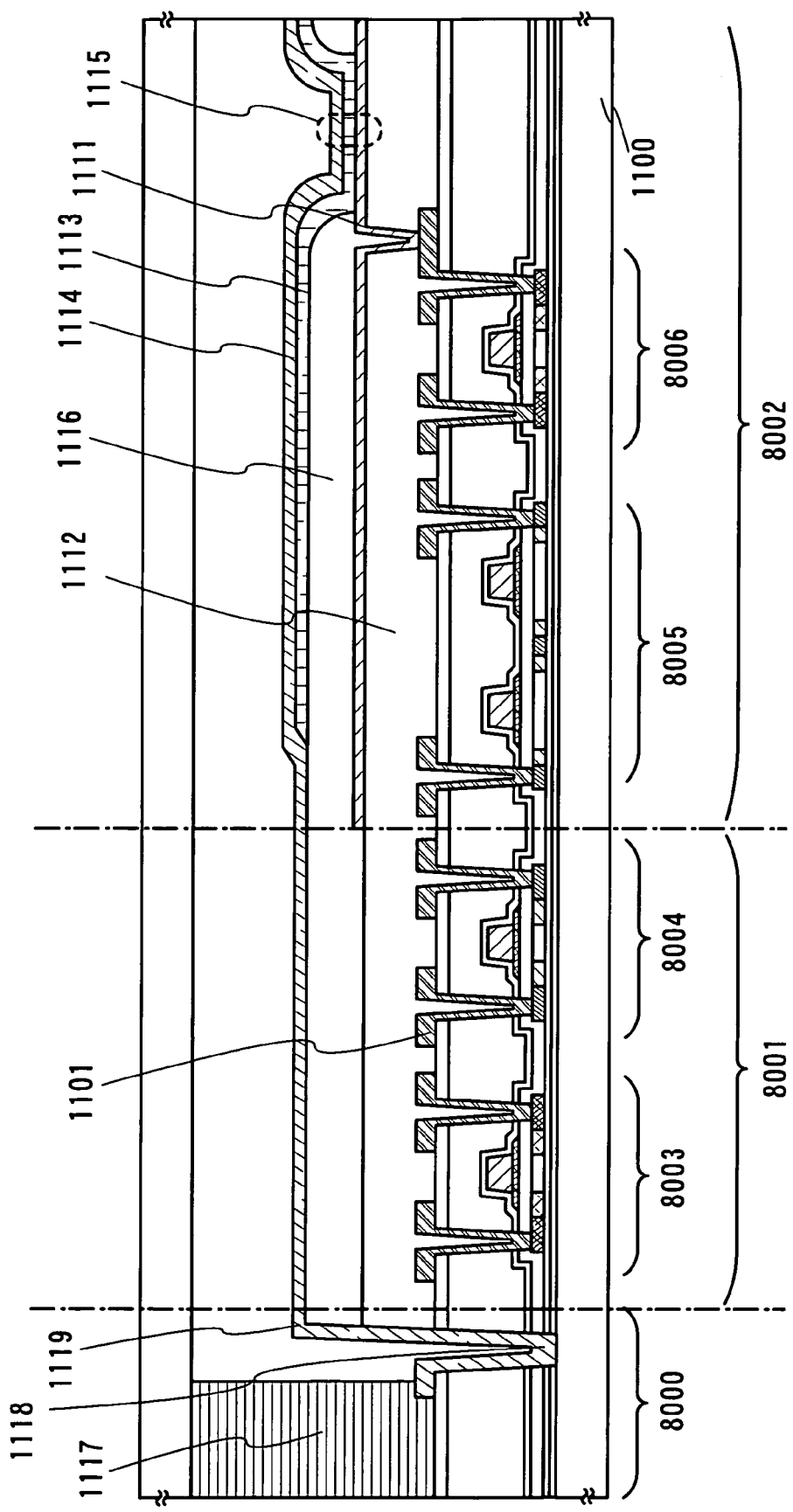
FIG. 18 is a cross-sectional view of a display device according to the present invention.

Referring FIG. 18, the present embodiment describes an example of the display device manufactured in Embodiment 2 or 3, each of which has a different connecting structure of a pixel electrode with a source and drain electrodes and a different structure of a sealing film. In FIG. 18, reference numeral 8000 denotes a sealing region; 8001, a peripheral circuit portion; 8002, a pixel portion; 8003 and 8006, p-channel type TFTs; 8004 and 8005, n-channel type TFTs; 1100, a substrate; 1101, a wiring; 1111 and 1114, electrodes (anode and cathode); 1112, a leveling layer; 1131, a light-emitting layer; 1115, a light-emitting element; 1116, a bank; 1118, an opening; 1119, a sealing film (protective film) covering the opening 1118 and side edge part; and 1117, a sealing agent.

As shown in FIG. 18, the leveling layer 1112 is formed on the wiring 1101 serving as a source and drain electrodes to provide the electrode 1111 thereon. At this time, the leveling layer 1112 may be an inorganic insulating film or an organic insulating film. It is effective to use the leveling film for further improvement on flatness. Nonphotosensitive acrylic, photosensitive acrylic, an inorganic material and the like can be used for the leveling layer 1112. In addition, a material in which a skeletal structure is formed by bonding of silicon and oxygen may be used. As the material in which a skeletal structure is formed by the bonding of silicon and oxygen, siloxanic polymer is cited as a typical example. Specifically, it is a material wherein a skeletal structure is formed by the bonding of silicon and oxygen and wherein a substituent includes at least hydrogen, or a material wherein a substituent includes at least one from the group consisting of fluorine, alkyl and aromatic hydrocarbon.

It is effective to flatten the steps due to a TFT by using a leveling film. Insufficient emitting due to the steps is likely to occur because the light-emitting layer formed later is very thin. Therefore, it is preferable to form a leveling film before forming the pixel electrode in order to form a light-emitting layer on a flat plane as far as possible.

The electrode 1114 including a conductive film is provided on the light-emitting layer 1113. In the present embodiment, an alloy of aluminum and lithium is used as the conductive film. Of course a well-known MgAg film (an alloy film of magnesium and silver) may be used. As a cathode material, a conductive film including a Group 1 element or Group 2 element of the periodic table, or a conductive film in which those elements are added may be used.

In the present embodiment, the sealing film 1119 is formed of the same material as that of the electrode 1114 in forming the electrode 1114 provided on the light-emitting layer. The opening 1118 reaching up to the substrate is formed, and the sealing film 1119 is formed so as to cover the opening. A conductive film having a function of a cathode and a sealing film is formed continuously up to outside of a peripheral circuit to cover inside EL element and TFT. Accordingly, even though moisture and oxygen enter through an interlayer film such as acrylic which is exposed to the external atmosphere, the moisture and oxygen can be shut off by the sealing film of the present invention. Therefore, the degradation due to moisture and oxygen of an EL display device can be prevented. Moreover, the electrode 1114 and the sealing film 1119 may be connected each other, and may also be formed separately by using a mask and the like.

In the present invention, although a film formed of the same material as that of a cathode is used as a sealing film, a passivation film may be formed on the cathode (a second electrode) to form the sealing film by the same steps and with the same material as those of the passivation film.

In the case of using acrylic and the like with hygroscopic property, the leveling film is likely to become a path for moisture at a place such as a peripheral circuit that is not to be flattened. Therefore, it also is effective to remove the leveling layer. However, in order to prevent damage on a film such as plasma due to dry etching and the like in removing the leveling film, an outer end part of the insulating layer may be covered with a sealing film including the same material as that of the electrode and the passivation film as described in Embodiment Mode 1 in the case of not removing the leveling layer.

In the present embodiment, although the sealing structure is used in the case of an EL display device, the sealing structure of the present invention is applicable to a liquid crystal display device having the structure using Embodiment 1 and the leveling film of the present embodiment. In that case, a display device using not a light-emitting element but a crystal for a display unit may be manufactured.

The present embodiment can be combined with Embodiment Mode 1 or 2, or any one of Embodiments 1 to 3, or the present embodiment can also be combined with plural from the embodiment modes and the embodiments above.

[Embodiment 5]

Various display devices (active matrix type display device) can be manufactured by applying the present invention. That is, the present invention is applicable to various electric equipment incorporating those display devices into the display unit.

As those electric equipment, a video camera, a digital camera, a projector, a head mount display (goggle-type display), a car navigation, a car stereo, a personal computer, a personal digital assistant (mobile computer, cell phone, electric book and the like) and the like are cited. FIGS. 12, 13 and 14 show an example of those.

FIG. 12(A) shows a personal computer, which includes a body 3001, an image inputting unit 3002, a display unit 3003, a keyboard 3004 and the like. A personal computer of the present invention is completed by applying a display device manufactured according to the present invention to the display unit 3003.

FIG. 12(B) shows a video camera, which includes a body 3101, a display unit 3102, an audio inputting unit 3103, an operating switches 3104, a battery 3105, a image receiving unit 3106 and the like. A video camera of the present invention is completed by applying a display device manufactured according to the present invention to the display unit 3102.

FIG. 12(C) shows a mobile computer, which includes a body 3201, a camera unit 3202, an image receiving unit 3203, an operating switch 3204, a display unit 3205 and the like. A mobile computer of the present invention is completed by applying a display device manufactured according to the present invention to the display unit 3205.

FIG. 12(D) shows a goggle-type display, which includes a body 3301, a display unit 3302, an arm unit 3303 and the like. In the display unit 3302, a flexible substrate is used as a substrate in order to manufacture the goggle-type display curving the display units 3302. In addition, a light and thin goggle-type display is realized. The goggle-type display of the present invention is completed by applying a display device manufactured according to the present invention to the display unit 3302.

FIG. 12(E) shows a player using a recording medium recording a program (hereinafter referred to as the recording medium), which includes a body 3401, a display unit 3402, a speaker unit 3403, a recording medium 3404, an operating switch 3405 and the like. Here, the player makes it possible to appreciate music and a movie, play a game and surf on the internet by using a DVD (Digital Versatile Disc), CD and the like as the recording medium. The recording medium of the present invention is completed by applying a display device manufactured according to the present invention to the display unit 3402.

FIG. 12(F) shows a digital camera, which includes a body 3501, a display unit 3502, a view finder 3503, an operating switches 3504, an image receiving unit (not shown in the figure) and the like. The digital camera of the present invention is completed by applying a display device manufactured according the present invention to the display unit 3502.

Figure 13A:
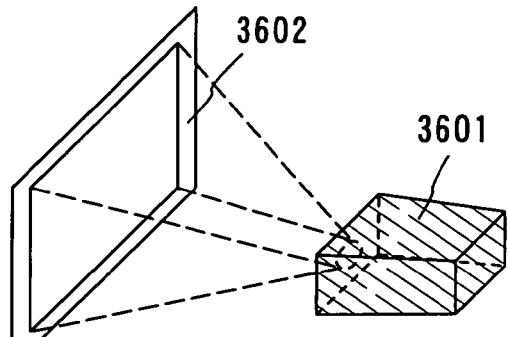
FIGS. 13A–13D are views showing an example of a display device.

FIG. 13(A) shows a front type projector, which includes a projection unit 3601, a screen 3602 and the like. A front type projector is completed by applying a display device manufactured according to the present invention to a liquid crystal display device 3808 forming a part of the projection unit 3601 and to other driving circuits.

Figure 13B:
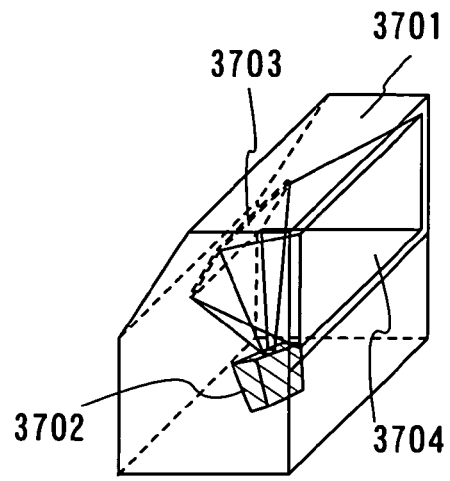

FIG. 13(B) shows a rear type projector, which includes a body 3701, a projection unit 3702, a mirror 3703, a screen 3704 and the like. A rear type projector is completed by applying a display device that is manufactured according to the present invention to the liquid crystal display device 3808 forming a part of the projection unit 3702 and to other driving circuit.

Figure 13C:
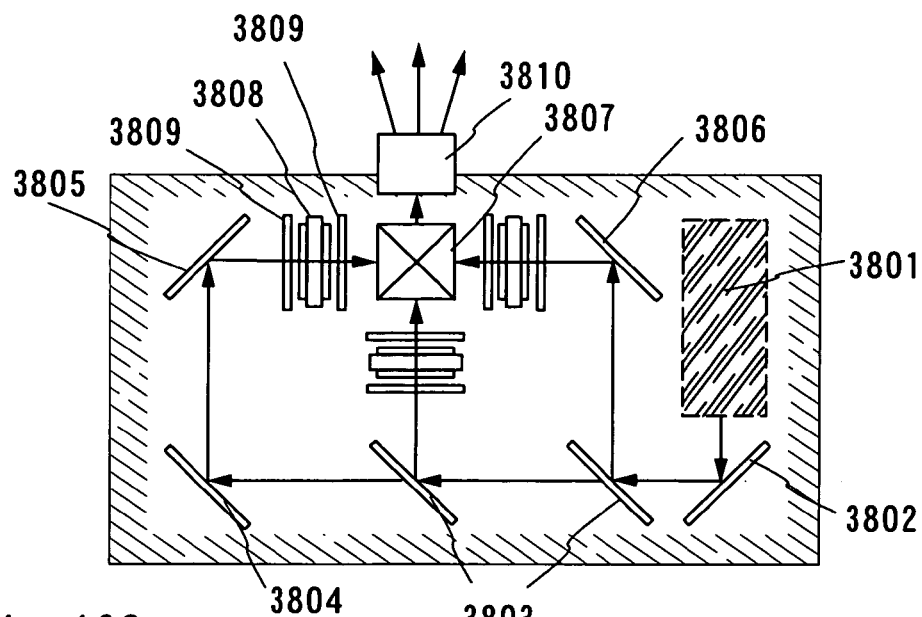

FIG. 13(C) shows an example of a structure of the projection units 3601 and 3702 that are shown in FIGS. 13(A) and 13(B), respectively. Each of the projection units 3601 and 3702 is comprised of a light source optical system 3801, mirrors 3802 and 3804 to 3806, dichroic mirrors 3803, a prism 3807, a liquid crystal display device 3808, phase difference plates 3809, and a projection optical system 3810. The projection optical system 3810 includes an optical system including projection lenses. The present embodiment shows an example of a three-plate system, but there are no special limitations. For instance, an optical system of single plate system is acceptable. Further, the operator may suitably set optical systems such as optical lenses, a polarizing film, a film to regulate the phase difference, an IR film, within an optical path shown by the arrows in FIG. 13(C).

Figure 13D:
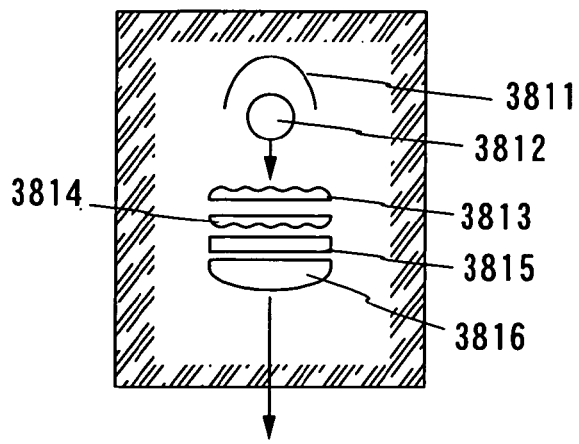

In addition, FIG. 13(D) shows an example of a structure of the light source optical system 3801 in FIG. 13(C). In the present embodiment, the light source optical system 3801 is composed of a reflector 3811, a light source 3812, lens arrays 3813 and 3814, a polarizing conversion element 3815, and a condenser lens 3816. Note that the light source optical system shown in FIG. 13(D) is an example, and there is no limitation specifically. For example, the operator may suitably set optical systems such as optical lenses, a polarizing film, a film to regulate the phase difference, and an IR film.

Here, the projector shown by FIGS. 13 shows the case of using a transparent electro-optic device, an example of application to a reflective electro-optic device and display device are not shown in the figure.

Figure 14A:
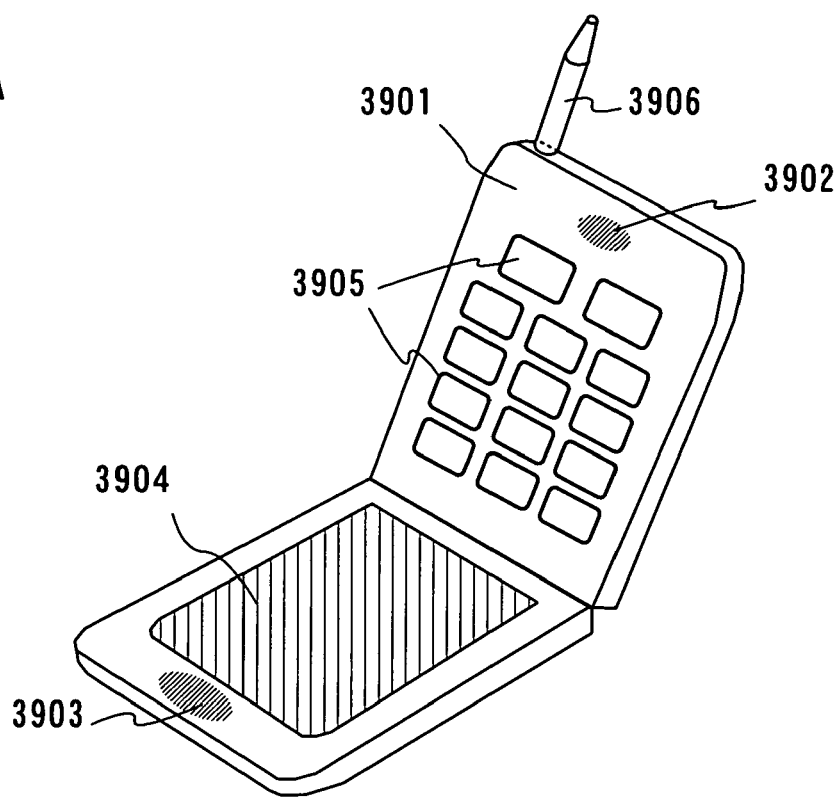
FIGS. 14A–14C are views showing an example of a display device.

FIG. 14(A) shows a cell phone, which includes a body 3901, an audio outputting unit 3902, an audio inputting unit 3903, a display unit 3904, an operating switches 3905, an antenna 3906 and the like. A cell phone of the present invention is completed by applying a display device manufactured according to the present invention to the display unit 3904.

Figure 14B:
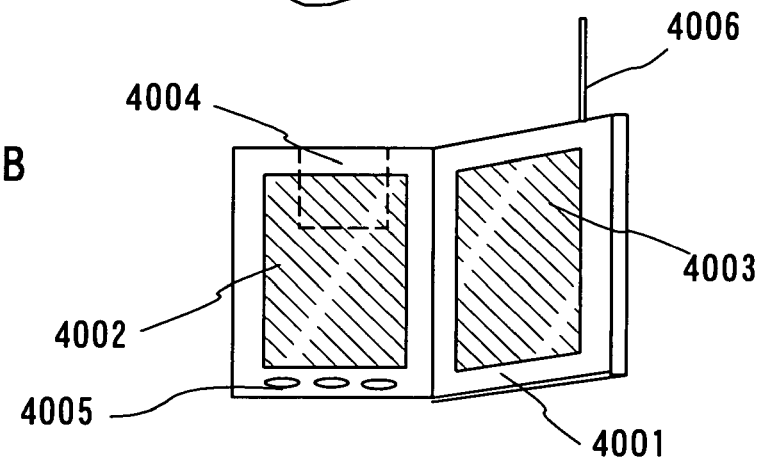

FIG. 14(B) shows a mobile book (electric book), which includes a body 4001, display units 4002 and 4003, a storage medium 4004, an operating switch 4005, an antenna 4006 and the like. A mobile book of the present invention is completed by applying the display device of the present invention to the display units 4002 and 4003.

Figure 14C:
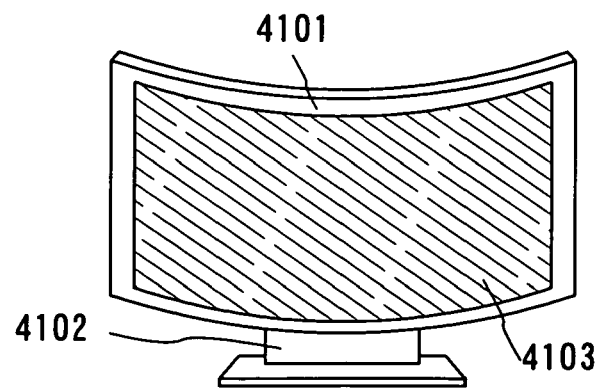

FIG. 14(C) shows a display, which includes a body 4101, a support table 4102, a display unit 4103 and the like. The display unit 4103 is manufactured by using a flexible substrate, thereby realizing a light and thin display. In addition, it is possible to curve the display unit 4103. A display of the present invention is completed by applying the display device manufactured according to the present invention to the display unit 4103.

As described above, the application of the present invention is extremely wide, and the present invention is applicable to electric equipment in various fields.

[Embodiment 6]

Referring to FIGS. 20 and 21, the present embodiment describes an example of a display device manufactured in Embodiment 2 or 3, each of which has a different structure of a sealing film.

In FIG. 20, reference numeral 2000 denotes a substrate; 2001, a wiring; 2011, an electrode (anode or cathode); 2013, a light-emitting layer; 2014, an electrode (anode or cathode), 2115; a light-emitting element; and 2017, a sealing agent. In FIG. 20, the sealing film 2019 is formed by the same steps and with the same material as those of the wiring 2001. FIG. 20 shows the structure in which the opening 2018 reaching up to the substrate 2000 is formed, and in which the sealing film 2019 covers the opening 2018, and a bare part of an insulating layer at an end part of the display device.

In FIG. 21, reference numeral 2100 denotes a substrate; 2101, a wiring; 2111, an electrode (anode or cathode); 2013, a light-emitting layer; 2114, an electrode (anode or cathode); 2115; a light-emitting element; and 2117, a sealing agent. In FIG. 21, a sealing film 2119a formed from the same material as that of the wiring 2101 and a sealing film 2119b formed from the same material as that of the pixel electrode 2111 are used. The sealing films 2119a and 2119b are formed by the same steps as that of the wiring 2101 and the pixel electrode 2111 at the same time, respectively. The opening 2118 reaching up to the substrate 2100 is formed in the sealing region so as to be covered with the sealing films 2119a and 2119b, and those sealing films covers a bare part of an insulating layer at an end part of the display device.

In the present embodiment, although the opening 2118 in the sealing region is formed so as to reach up to the substrate, it is acceptable that the sealing film reaches only to dense base film. It is enough if an opening is formed on a hydrophilic film to be a path for moisture. Therefore, a depth of the opening may be suitably set. The present embodiment is an example of the present invention, and the present invention is not limited to the present embodiment.

According to the present invention, moisture and oxygen are shut off by a sealing film even though the moisture and the oxygen enters through an interlayer film and a leveling layer 2012 such as acrylic exposed to a sealing agent and the external atmosphere. Therefore, an EL element and a TFT inside of the display device can be protected. Accordingly, the degradation due to moisture and oxygen of the EL display device can be prevented. In addition, when the plural sealing films are stacked as shown in FIG. 21, capability of shutting off contaminated materials such as moisture is further improved.

Figure 23:
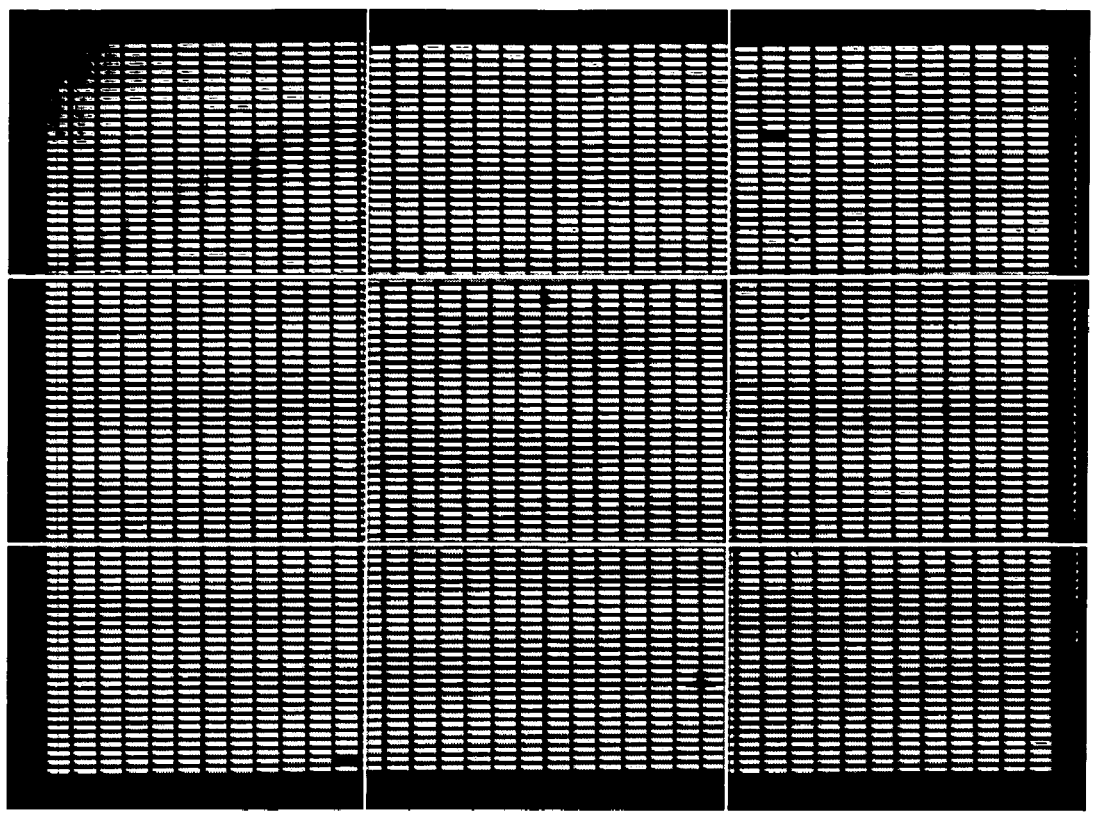
FIG. 23 is a view showing a result of a reliability evaluation of a display device according to the present invention.
Figure 24:
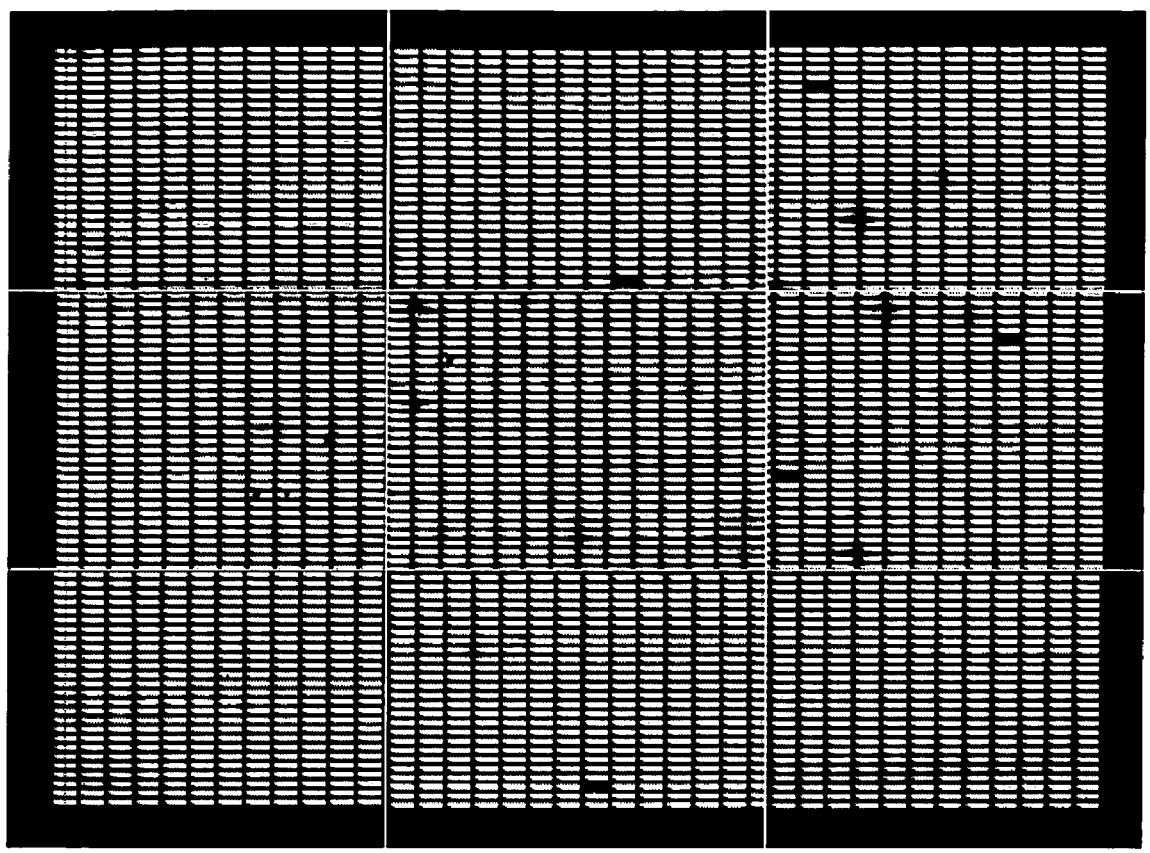
FIG. 24 is a view showing a result of a reliability evaluation of a display device according to the present invention.

A display device of the present invention is manufactured to be evaluated in its reliability. In the reliability evaluation, change in luminance is examined by storing the display device at a temperature of 65° C., a humidity of 95% for approximately 500 hours. FIG. 23 shows light emission of a display device having the structure of FIG. 20, and FIG. 24 shows a display device having the structure of FIG. 21. Each of the display devices after being stored for 500 hours under the conditions above is shown. Pictures in FIGS. 23 and 24 show light emission of nine parts emitting a light respectively in a pixel region.

In the display device in which an EL element and a TFT is protected, a luminance degradation begins a little from upper-right corner and lower-left corner, however, a serious degradation is not found. In addition, a display device in which the sealing film is stacked to form a lamination layer structure in FIG. 24, such degradation is hardly founded. This implies that moisture are shut off several times and cannot enter inside of the display device by covering an opening and end part with the sealing film. Moreover, by stacking plural sealing films to the lamination layer, blocking capability is found to be improved and the degradation of the display device can be prevented.

According to the display device of the present invention, a film such as an interlayer film is no longer to be exposed to external atmosphere. Therefore, it becomes possible to prevent moisture and oxygen outside of the display device from entering the display device through the interlayer film and the interspace between films. Accordingly, the reliability of the display device can be enhanced by preventing various degradations caused by moisture and oxygen such as contamination of an inner part of the display device, the degradation of electric properties, a dark spot and shrink. Moreover, in the present invention, a display device with high reliability can be manufactured without increasing the manufacturing steps because a film using the same material as that of a film which forms the display device is used for a sealing film.

[Embodiment 7]

The present embodiment shows display devices each having different wiring arrangement drawn into an end part of the display device with reference to FIGS. 1, 19, 22 and 25.

Figure 1:
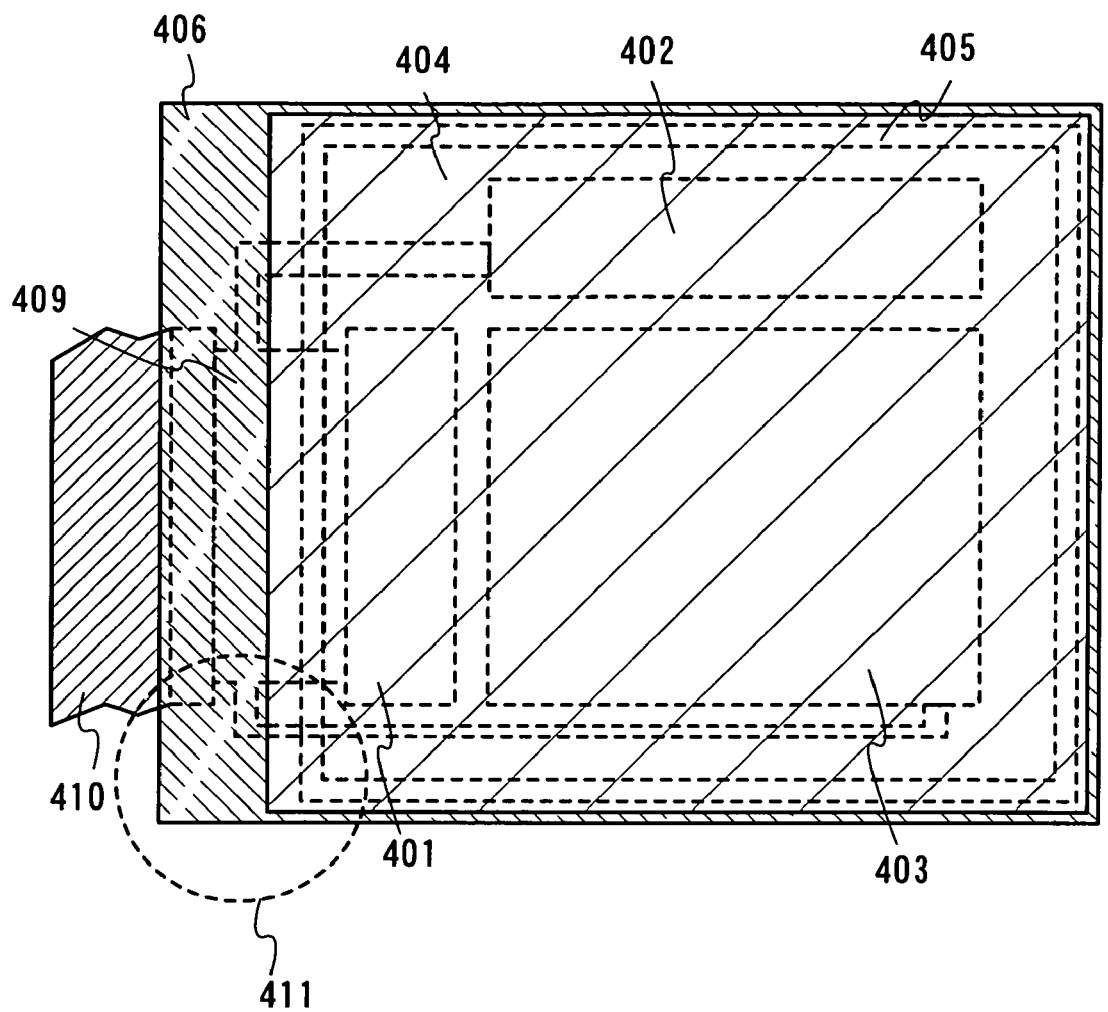
FIG. 1 is a top view showing a conventional display device.
Figure 2:
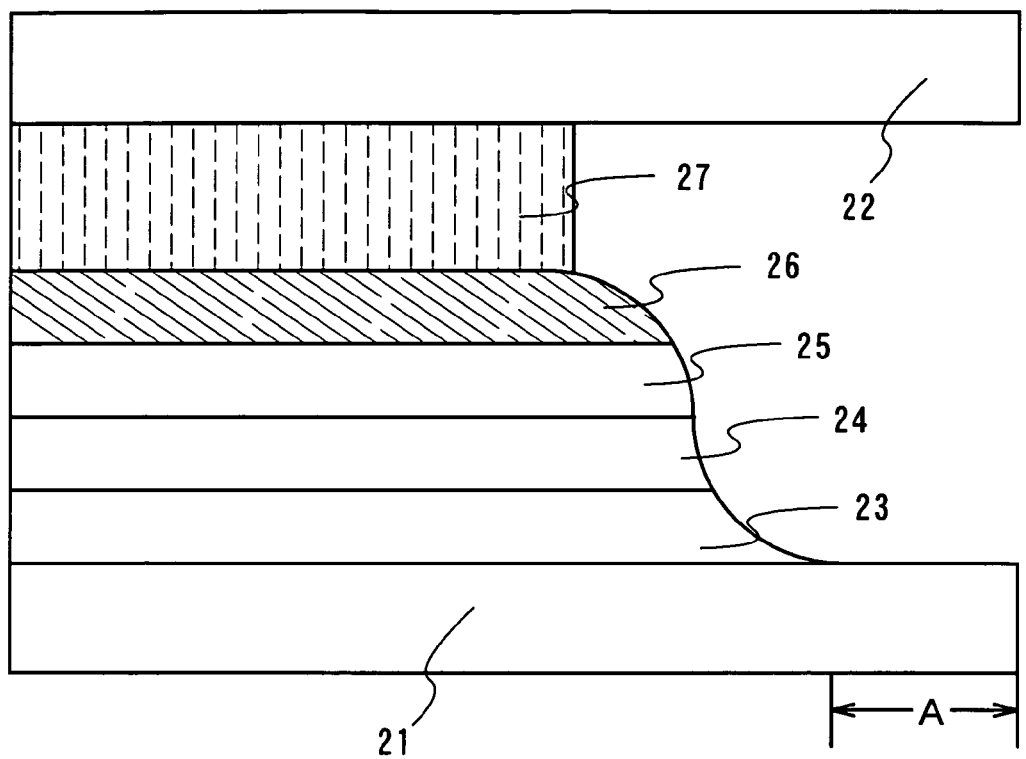
FIG. 2 is a view showing a conventional structure.
Figure 19:
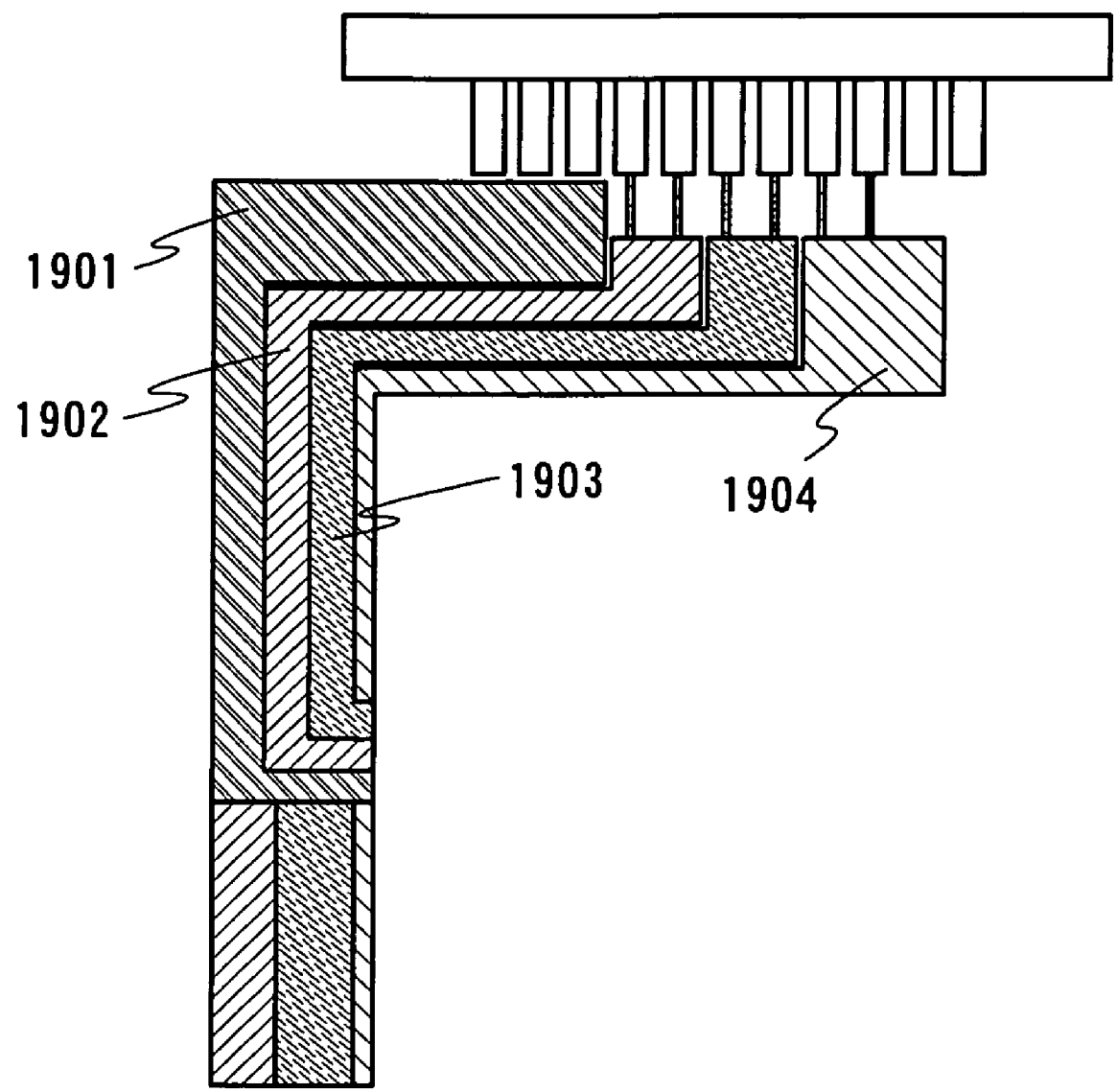
FIG. 19 is a top view of a conventional display device.

In FIG. 1, the wiring of a pixel portion is connected to an FPC (flexible print circuit) in the region 411. FIG. 19 shows an enlarged view of the region 411. FIG. 19 shows a conventional wiring arrangement. Reference numeral 1901 denotes a cathode; 1902, a first anode; 1903, a second anode; and 1904, a third anode. In the conventional arrangement, the cathode 1901 serving as a wiring of outermost circumference connects to an FPC at innermost. Accordingly, the end part of the display device cannot be covered with a wiring at the outermost circumference. Therefore, moisture and the like enter the display device and the degradation of the display device is not prevented.

Figure 22:
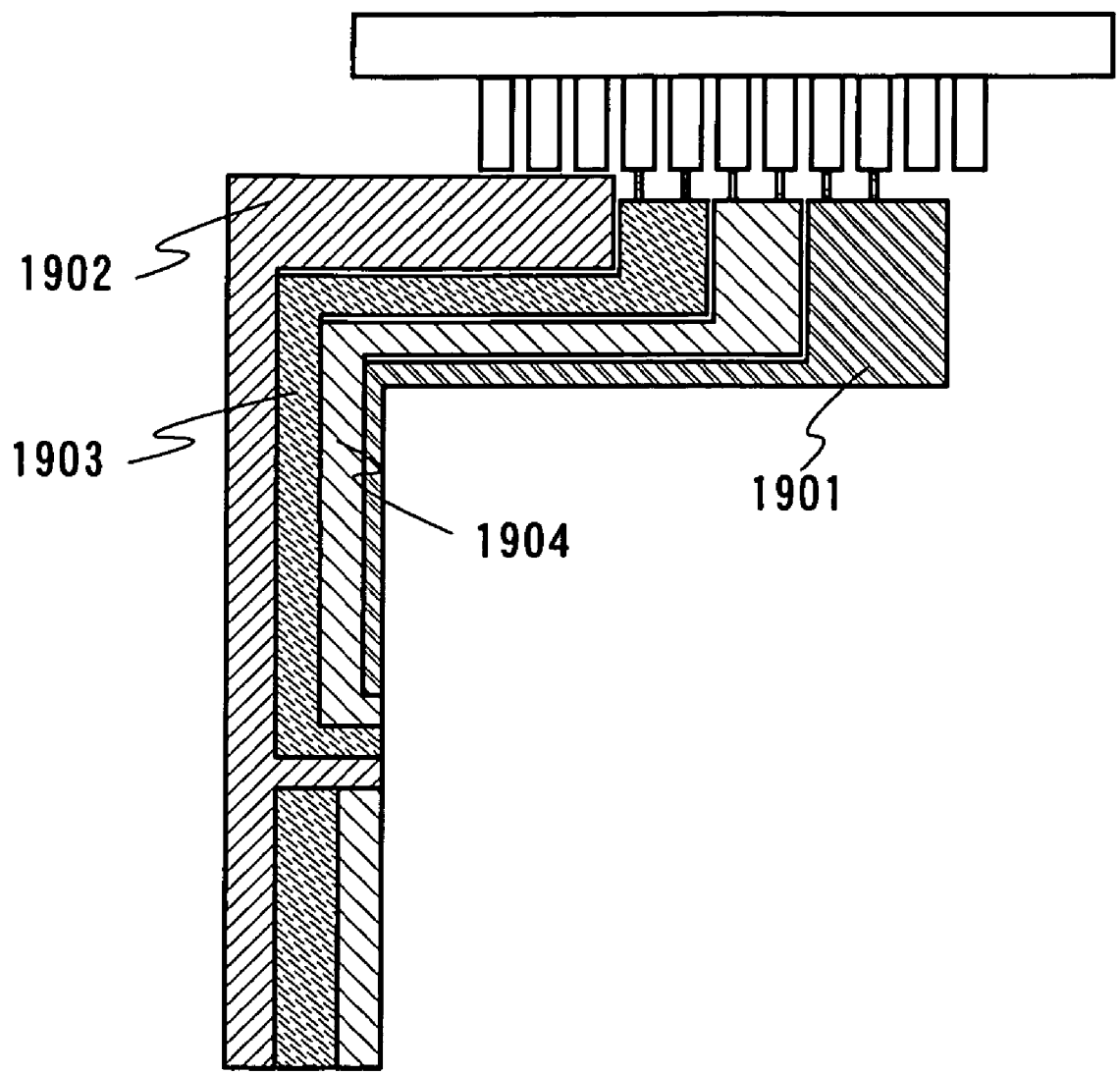
FIG. 22 is a top view of a display device according to the present invention.

FIG. 22 is a view showing wiring arrangement of a display device according to the present invention. The first anode 1902 connecting to an FPC at outermost of the display device is arranged outermost. Therefore, it becomes possible that the wiring of the outermost circumference covers an end part of the display device completely without any interspace, and moisture can be shut off sufficiently.

As for the arrangement of the wiring, it is enough if an outermost circumference wiring connects other wiring such as an FPC on the outermost side; therefore, the kind, polarity and number of the wiring may be suitably set.

Figure 25:
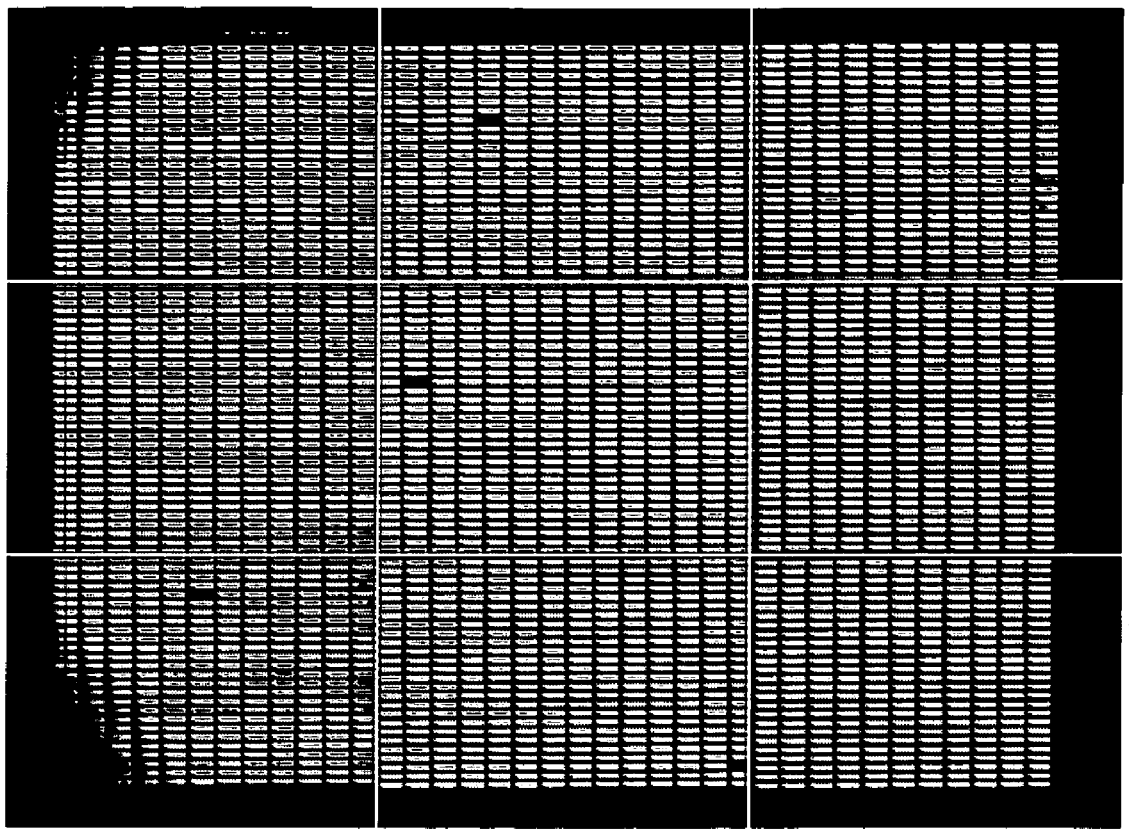
FIG. 25 is a view showing a result of a reliability evaluation of a display device according to the present invention.
Figure 26:
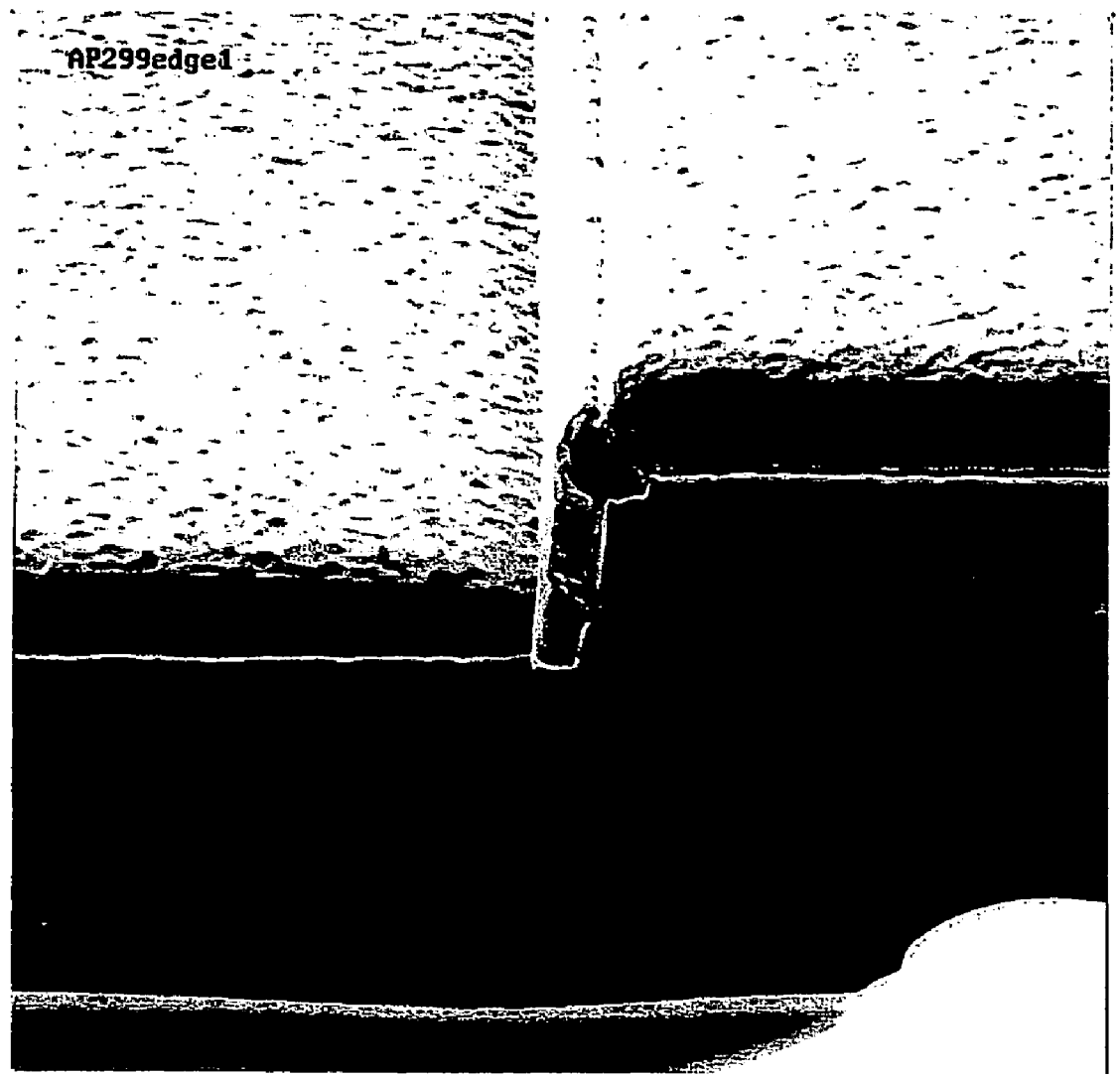
FIG. 26 is a view showing a display device according to the present invention.
Figure 27:
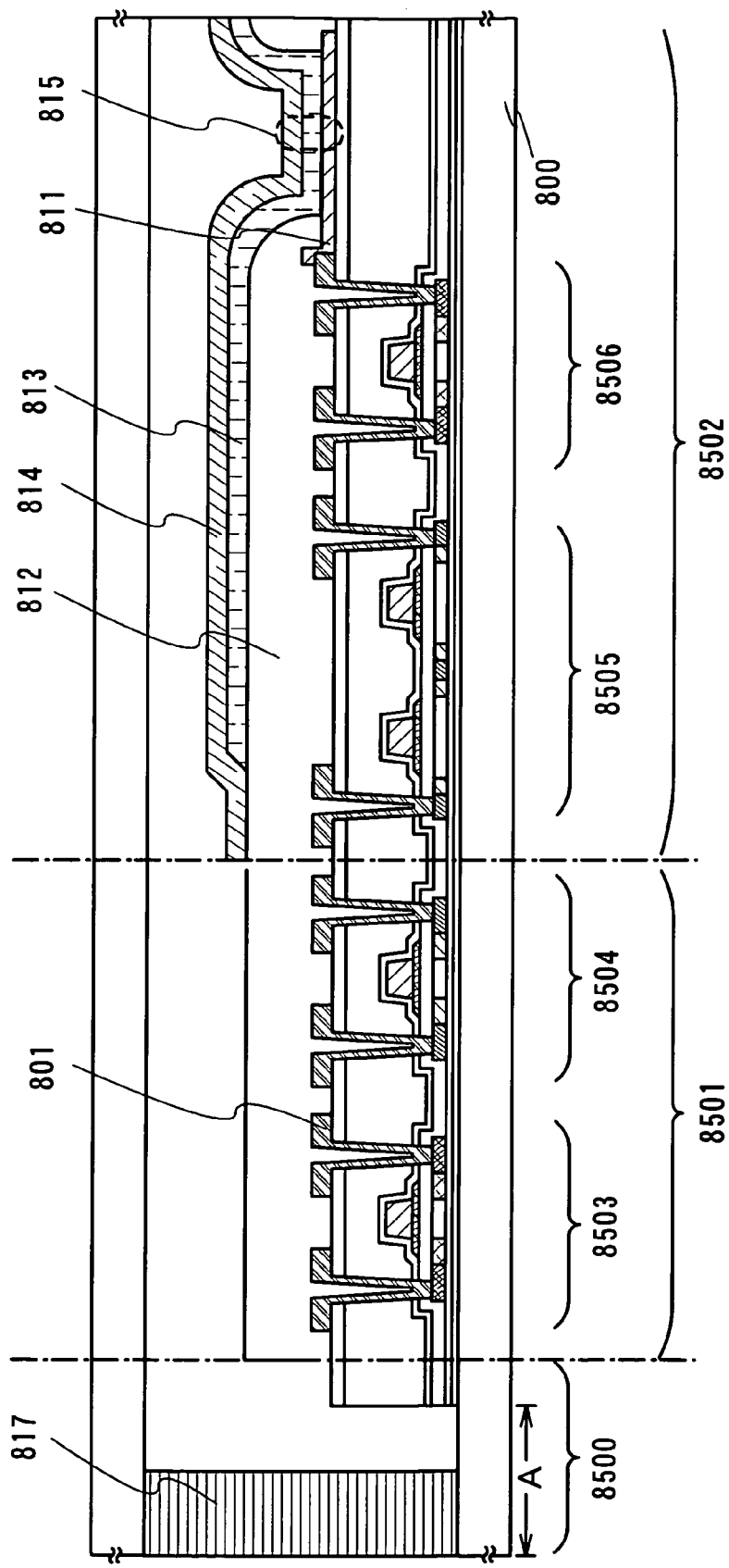
FIG. 27 is a cross-sectional view showing a conventional EL display device.

A display device having the wiring arrangement of FIG. 22 and the structure of FIG. 20 is manufactured and evaluated in its reliability. In the reliability evaluation, change in luminance is examined by storing the display device at a temperature of 65° C., a humidity of 95% for approximately 570 hours. FIG. 25 shows a light emission of the display device having structures of FIGS. 20 and 22 after being stored for 500 hours under the conditions above.

As shown in FIG. 25, although the luminance degradation called shrink is appeared a little on upper and lower left side, the display device is hardly degraded. In addition, the degree of the degradation is a bit lighter compared to the conventional display device shown in FIG. 23 having the wiring arrangement of FIG. 19. Therefore, according to the present invention, it is found that the effect of preventing a display device from degradation is enhanced.

According to the structure of the present invention, it becomes possible to prevent various degradations caused by moisture and oxygen such as contamination of an inner part of the display device, the degradation of electric properties, a dark spot and shrink, therefore, the reliability of the display device is enhanced.

The invention claimed is:

1. A display device comprising:
   a pair of substrates;
   a base film formed on either one surface of the substrates;
   an insulating film formed over the base film;
   a display unit formed over the insulating film;
   a light-emitting element formed in the display unit;
   a sealing film formed over the display unit; and
   a sealing agent formed outside of the display unit so as to surround a periphery of the display unit,
   wherein the pair of substrates are attached to each other by the sealing agent,
   wherein at least one layer of the insulating film is formed from an organic resin material,
   wherein the insulating film has an opening to be covered with the sealing film,
   wherein the base film is in contact with the sealing film in the opening, and
   wherein the sealing agent is formed adjoining to the sealing film.

2. A display device comprising:
   a pair of substrates;
   a base film formed on either one surface of the substrates;
   an insulating film formed over the base film;
   a display unit formed over the insulating film;
   a light-emitting element formed in the display unit;
   a sealing film formed over the display unit; and
   a sealing agent formed outside of the display unit so as to surround a periphery of the display unit,
   wherein the pair of substrates are attached to each other by the sealing agent,
   wherein at least one layer of the insulating film is formed from an organic resin material,
   wherein the insulating film has an opening to be covered with the sealing film,
   wherein the base film is in contact with the sealing film in the opening, and
   wherein an outer end part of the base film located outside of the sealing agent is in contact with the sealing film.

3. A display device comprising:
   a pair of substrates;

a base film formed on either one surface of the substrates;
an insulating film formed over the base film;
a display unit formed over the insulating film;
a light-emitting element formed in the display unit;
a sealing film formed over the display unit; and
a sealing agent formed outside of the display unit so as to surround a periphery of the display unit,
wherein the pair of substrates are attached to each other by the sealing agent,
wheiein at least one layer of the insulating film is formed from an organic resin material,
wherein the insulating film has plural openings to be covered with the sealing film,
wherein the base film is in contact with the sealing film in the plural openings, and
wherein the sealing agent is formed adjoining to the sealing film.

4. A display device comprising:
a pair of substrates;
a base film formed on either one surface of the substrates;
an insulating film formed over the base film;
a display unit formed over the insulating film;
a light-emitting element formed in the display unit;
a sealing film formed over the display unit; and
a sealing agent formed outside of the display unit so as to surround a periphery of the display unit,
wherein the pair of substrates are attached to each other by the sealing agent,
wherein at least one layer of the insulating film is formed from an organic resin material,
wherein the insulating film has plural openings to be covered with the sealing film,
wherein the base film is in contact with the sealing film in the plural openings, and
wherein an outer end part of the base film located outside of the sealing agent is in contact with the sealing film.

5. A display device according to claim 1, wherein the sealing film includes one or plural kinds of films selected from a group consisting of a conductive thin film and an insulating thin film.

6. A display device according to claim 1, wherein the sealing film includes one or plural kinds of elements selected from a group consisting of Al, Ti, Mo, W and Si.

7. A display device according to claim 1, wherein the sealing film includes one or plural kinds of films selected from a group consisting of a silicon nitride film, a silicon nitride oxide film or a nitrogen-containing carbon film.

8. A display device according to claim 1, wherein the organic resin material includes one or plural kinds of materials selected from a group consisting of silicon oxide including acrylic, polyamide and polyimide.

9. A display device according to claim 2, wherein the sealing film includes one or plural kinds of films selected from a group consisting of a conductive thin film and an insulating thin film.

10. A display device according to claim 2, wherein the sealing film includes one or plural kinds of elements selected from a group consisting of Al, Ti, Mo, W and Si.

11. A display device according to claim 2, wherein the sealing film includes one or plural kinds of films selected from a group consisting of a silicon nitride film, a silicon nitride oxide film or a nitrogen-containing carbon film.

12. A display device according to claim 2, wherein the organic resin material includes one or plural kinds of materials selected from a group consisting of silicon oxide including acrylic, polyamide and polyimide.

13. A display device according to claim 3, wherein the sealing film includes one or plural kinds of films selected from a group consisting of a conductive thin film and an insulating thin film.

14. A display device according to claim 3, wherein the sealing film includes one or plural kinds of elements selected from a group consisting of Al, Ti, Mo, W and Si.

15. A display device according to claim 3, wherein the sealing film includes one or plural kinds of films selected from a group consisting of a silicon nitride film, a silicon nitride oxide film or a nitrogen-containing carbon film.

16. A display device according to claim 3, wherein the organic resin material includes one or plural kinds of materials selected from a group consisting of silicon oxide including acrylic, polyamide and polyimide.

17. A display device according to claim 4, wherein the sealing film includes one or plural kinds of films selected from a group consisting of a conductive thin film and an insulating thin film.

18. A display device according to claim 4, wherein the sealing film includes one or plural kinds of elements selected from a group consisting of Al, Ti, Mo, W and Si.

19. A display device according to claim 4, wherein the sealing film includes one or plural kinds of films selected from a group consisting of a silicon nitride film, a silicon nitride oxide film or a nitrogen-containing carbon film.

20. A display device according to claim 4, wherein the organic resin material includes one or plural kinds of materials selected from a group consisting of silicon oxide including acrylic, polyamide and polyimide.

* * * * *